US008599897B2

United States Patent
Cox et al.

(10) Patent No.: US 8,599,897 B2
(45) Date of Patent: *Dec. 3, 2013

(54) TUNABLE DETECTOR

(75) Inventors: James A. Cox, New Brighton, MN (US); Robert A. Morgan, Plymouth, MN (US)

(73) Assignee: Finisar Corporation, Sunnyvale, CA (US)

( * ) Notice: Subject to any disclaimer, the term of this patent is extended or adjusted under 35 U.S.C. 154(b) by 2722 days.

This patent is subject to a terminal disclaimer.

(21) Appl. No.: 10/948,870

(22) Filed: Sep. 24, 2004

(65) Prior Publication Data

US 2005/0036533 A1    Feb. 17, 2005

Related U.S. Application Data

(63) Continuation of application No. 10/121,490, filed on Apr. 12, 2002, now Pat. No. 6,836,501, which is a continuation-in-part of application No. 09/751,422, filed on Dec. 29, 2000, now Pat. No. 6,782,027.

(51) Int. Cl.
    *G02B 6/42* (2006.01)
(52) U.S. Cl.
    USPC .......................................... 372/99
(58) Field of Classification Search
    USPC .......................................... 372/99
    See application file for complete search history.

(56) References Cited

U.S. PATENT DOCUMENTS

| 4,317,085 A | 2/1982 | Burnham et al. ........... 372/50 |
| 4,466,694 A | 8/1984 | MacDonald .................. 385/37 |
| 4,660,207 A | 4/1987 | Svilans ....................... 372/45 |
| 4,784,722 A | 11/1988 | Liau et al. |
| 4,885,592 A | 12/1989 | Kofol et al. |
| 4,901,327 A | 2/1990 | Bradley |
| 4,904,045 A | 2/1990 | Alferness et al. |
| 4,943,970 A | 7/1990 | Bradley |
| 4,956,844 A | 9/1990 | Goodhue et al. |
| 5,031,187 A | 7/1991 | Orenstein et al. |

(Continued)

FOREIGN PATENT DOCUMENTS

| DE | 4 240 706 | 6/1994 |
| EP | 0 288 184 | 10/1988 |

(Continued)

OTHER PUBLICATIONS

Morgan, et al., "Producible Ga-AS-based MOVPE-Grown Vertical-Cavity Top-Surface Emitting Lasers with Record Performance." *Elec. Lett.*, vol. 31, No. 6, pp. 462-464, Mar. 16, 1995.

(Continued)

*Primary Examiner* — Hrayr A Sayadian
(74) *Attorney, Agent, or Firm* — Maschoff Brennan

(57) ABSTRACT

This disclosure is generally concerned with optical systems that employ guided-mode grating resonant reflector filters ("GMGRF") to facilitate wavelength and/or polarization selectivity in the optical system. In one example, an optical system is provided that includes first and second tunable detectors. Each of the tunable detectors includes a GMGRF that is tuned to select a corresponding optical wavelength and/or polarization of an optical data channel, such that the optical wavelength and/or polarization associated with the first tunable detector is different from the optical wavelength and/or polarization associated with the second tunable detector. In this way, an array of tunable detectors can be employed to select some or all of the wavelengths and/or polarizations of an optical data signal having a plurality of data channels.

21 Claims, 20 Drawing Sheets

(56) References Cited

U.S. PATENT DOCUMENTS

| | | | |
|---|---|---|---|
| 5,052,016 A | 9/1991 | Mahbobzadeh et al. | |
| 5,056,098 A | 10/1991 | Anthony et al. | |
| 5,062,115 A | 10/1991 | Thornton | |
| 5,068,869 A | 11/1991 | Wang et al. | |
| 5,079,774 A | 1/1992 | Mendez et al. | |
| 5,115,442 A | 5/1992 | Lee et al. | |
| 5,117,469 A | 5/1992 | Cheung et al. | |
| 5,140,605 A | 8/1992 | Paoli et al. | |
| 5,157,537 A | 10/1992 | Rosenblatt | |
| 5,158,908 A | 10/1992 | Blonder et al. | |
| 5,216,263 A | 6/1993 | Paoli | |
| 5,216,680 A | 6/1993 | Magnusson et al. | |
| 5,237,581 A | 8/1993 | Asada et al. | |
| 5,245,622 A | 9/1993 | Jewell et al. | |
| 5,258,990 A | 11/1993 | Olbright et al. | |
| 5,285,466 A | 2/1994 | Tabatabaie | |
| 5,293,392 A | 3/1994 | Shieh et al. | |
| 5,317,170 A | 5/1994 | Paoli | |
| 5,317,587 A | 5/1994 | Ackley et al. | |
| 5,325,386 A | 6/1994 | Jewell et al. | |
| 5,331,654 A | 7/1994 | Jewell et al. | |
| 5,337,074 A | 8/1994 | Thornton | |
| 5,337,183 A | 8/1994 | Rosenblatt et al. | |
| 5,349,599 A | 9/1994 | Larkins | |
| 5,351,256 A | 9/1994 | Schneider et al. | |
| 5,359,447 A | 10/1994 | Hahn et al. | |
| 5,359,618 A | 10/1994 | Lebby et al. | |
| 5,363,397 A | 11/1994 | Collins et al. | |
| 5,373,520 A | 12/1994 | Shoji et al. | |
| 5,386,426 A | 1/1995 | Stephens | |
| 5,390,209 A | 2/1995 | Vakhshoori | |
| 5,396,508 A | 3/1995 | Bour et al. | |
| 5,404,373 A | 4/1995 | Cheng | |
| 5,412,678 A | 5/1995 | Treat et al. | |
| 5,412,680 A | 5/1995 | Swirhun et al. | |
| 5,416,044 A | 5/1995 | Chino et al. | |
| 5,428,634 A | 6/1995 | Bryan et al. | |
| 5,438,584 A | 8/1995 | Paoli et al. | |
| 5,446,754 A | 8/1995 | Jewell et al. | |
| 5,465,263 A | 11/1995 | Bour et al. | |
| 5,475,701 A | 12/1995 | Hibbs-Brenner | |
| 5,497,390 A | 3/1996 | Tanaka et al. | |
| 5,513,202 A | 4/1996 | Kobayashi et al. | |
| 5,530,715 A | 6/1996 | Shieh et al. | |
| 5,555,255 A | 9/1996 | Kock et al. | |
| 5,557,626 A | 9/1996 | Grodzinski et al. | |
| 5,561,683 A | 10/1996 | Kwon | |
| 5,568,499 A | 10/1996 | Lear | |
| 5,586,131 A | 12/1996 | Ono et al. | |
| 5,590,145 A | 12/1996 | Nitta | |
| 5,598,300 A | 1/1997 | Magnusson et al. | |
| 5,606,572 A | 2/1997 | Swirhun et al. | |
| 5,625,729 A | 4/1997 | Brown | |
| 5,642,376 A | 6/1997 | Olbright et al. | |
| 5,645,462 A | 7/1997 | Banno et al. | |
| 5,646,978 A | 7/1997 | Klem et al. | |
| 5,648,978 A | 7/1997 | Sakata | |
| 5,673,284 A | 9/1997 | Congdon et al. | |
| 5,699,373 A | 12/1997 | Uchida et al. | |
| 5,712,188 A | 1/1998 | Chu et al. | |
| 5,726,805 A | 3/1998 | Kaushik et al. | |
| 5,727,013 A | 3/1998 | Botez et al. | |
| 5,727,014 A | 3/1998 | Wang et al. | |
| 5,774,487 A | 6/1998 | Morgan | |
| 5,778,018 A | 7/1998 | Yoshikawa et al. | |
| 5,784,399 A | 7/1998 | Sun | |
| 5,818,066 A | 10/1998 | Duboz | |
| 5,828,684 A | 10/1998 | Van de Walle | |
| 5,835,521 A | 11/1998 | Ramdani et al. | |
| 5,901,166 A | 5/1999 | Nitta et al. | |
| 5,903,590 A | 5/1999 | Hadley et al. | |
| 5,940,422 A | 8/1999 | Johnson | |
| 5,953,362 A | 9/1999 | Pamulapati et al. | |
| 5,978,401 A | 11/1999 | Morgan | |
| 5,995,531 A | 11/1999 | Gaw et al. | |
| 6,002,705 A | 12/1999 | Thornton | |
| 6,008,675 A | 12/1999 | Handa | |
| 6,043,104 A | 3/2000 | Uchida et al. | |
| 6,055,262 A * | 4/2000 | Cox et al. | 372/96 |
| 6,154,480 A | 11/2000 | Magnusson et al. | |
| 6,191,890 B1 | 2/2001 | Baets et al. | |
| 6,212,312 B1 | 4/2001 | Grann et al. | |
| 6,782,027 B2 * | 8/2004 | Cox et al. | 372/50.1 |
| 6,836,501 B2 * | 12/2004 | Cox et al. | 372/108 |

FOREIGN PATENT DOCUMENTS

| | | |
|---|---|---|
| EP | 0 776 076 | 5/1997 |
| JP | 60-123084 | 7/1985 |
| JP | 02-054981 | 2/1990 |
| JP | 05-299779 | 11/1993 |
| WO | 98/57402 | 12/1998 |

OTHER PUBLICATIONS

Morgan, et al., "Spatial-Filtered Vertical-Cavity Top Surface-Emitting Lasers," CLEO, 1993, pp. 138-139.

Morgan, et al., "Vertical Cavity Surface Emitting Laser Arrays: Come of Age," Invited Paper, SPIE, vol. 2683, 0/8194-2057-3/96, pp. 18-29.

S.S. Wang and R. Magnusson, "Multilayer Waveguide-Grating Filters," Appl. Opt., vol. 34, No. 14, pp. 2414-2420, 1995, May 1995.

S.S. Wang and R. Magnusson, "Theory and Applications of Guided-Mode Resonance Filters," Appl. Opt., vol. 32, No. 14, pp. 2606-2613, 1993.

International Search Report, dated Sep. 17, 2003 relative to PCT Application No. PCT/US 03/11093, the foreign equivalent to the instant U.S. Appl. No. 10/121,490.

Cox, et al., "Guided-Mode Grating Resonant Filters for VCSEL Applications," Jan. 28, 1998, Proceedings of the SPIE, SPIE, Bellingham, VA, US, vol. 3291, pp. 70-76.

Min Soo Park and Byung Tae Ahn, "Polarization Control of Vertical-Cavity Surface-Emitting Lasers by Elector-Optic Birefrigence," Applied Physics Letters, vol. 76, No. 7, pp. 813-815, Feb. 14, 2000.

Tshikazu Mukaihara, et al., "A Novel Birefringent Distributed Bragg Reflector Using a Metal/Dielectric Polarizer for Polarization Control of Surface-Emittting Lasers," Japan J. Appl. Phys., vol. 33, Part 2, No. 2B, Feb. 15, 1994, pp. L227-L229.

Hideaki Saitao, et al., "Controlling Polarization of Quantum-Dot Surface-Emitting Lasers by Using Structurally Anisotropic Self-Assembled Quantum Dots," American Institute of Physics, Applied Physics Letters, 71(5), Aug. 4, 1997, pp. 590-592.

T. Mukaihara, "Polarization Control of Vertical-Cavity Surface-Emitting Lasers by a Birefringent Metal/Semiconductor Polarizer Terminating a Distributed Bragg Reflector," Tokyo Institute of Technology, Precision and Intelligence Laboratory, pp. 183-184.

Guenter, et al., "Reliability of Proton-Implanted VCSELs for Data Communications," Invited Paper, SPIE, Vo., 2683, OE LASE 96, Photonics West: Fabrication, Testing and Reliability of Semiconductors Lasers (SPIE, Bellingham, WA 1996).

Hibbs-Brenner, et al., "Performance, Uniformity and Yield of 850nm VCSELs Deposited by MOVPE," IEEE Photonics Technology Letters, vol. 8, No. 1, Jan. 1996, pp. 7-9.

Hornak, et al., "Low-Temperature (10K-300K0 Characterization of MOVPE-Grown Vertical-Cavity Surface-Emitting Lasers," Photonics Technology Letters, vol. 7, No. 10, Oct. 1995, pp. 1110-1112.

Huffaker, et al., "Lasing Characteristics of Low Threshold Microcavity Layers Using Half-Wave Spacer Layers and Lateral Index Confinement," Applied Physics Letters, vol. 66, No. 14, Apr. 3,1995, pp. 1723-1725.

K. L. Lear, et al., "Selectively Oxidized Vertical Cavity Surface-Emitting Lasers with 50% Power Conversion Efficiency," Electronic Letters, vol. 31, No. Feb. 2, 1995, pp. 208-209.

Lehman, et al., "High Frequency Modulation Characteristics of Hybrid Dielectric/AlGaAs Mirror Singlemode VCSELs," Electronic Letters, vol. 31, No. 15, pp. 1251-1252, Jul. 20, 1995.

Magnusson, "Integration of Guided-Mode Resonance Filters and VCSELs," Electo-Optics Research Center, Department of Electrical Engineering, University of Texas at Arlington, May 6, 1997. • •.

(56) References Cited

OTHER PUBLICATIONS

Morgan, et al. "One Watt Vertical Cavity Surface Emitting Laser," *Electronic Letters*, vol. 29, No. 2, Jan. 21, 1993, pp. 206-207.

Schubert, "Resonant Cavity Light-Emitting Diode," *Applied Physics Letters*, vol. 60, No. 8, Feb. 24, 1992, pp. 921-923.

Y. M. Yang, et al., "Ultralow Threshold Current Vertical Cavity Surface Emitting Lasers Obtained with Selective Oxidation," *Electronic Letter*, vol. 31, No. 11, Mary 25, 1995, pp. 886-888.

Yablonovitch, et al., "Photonic Bandgap Structures," *J. Opt. Soc. Am. B.*, Bill-of-lading. 10, No. 2, Feb. 1993, pp. 283-295.

Young, et al., "Enhanced Performance of Offset-Gain High Barrier Vertical-Cavity Surface-Emitting Lasers," *IEEE J. Quantum Electronic*, vol. 29, No. 6, Jun. 1993, pp. 2013-20222.

Smith, et al., Polarization-Sensitive Subwavelength Antireflection Surfaces on a Semiconductor for 975 NM, *Optics Letters*, vol. 21, No. 15, Aug. 1, 1996, pp. 1201-1203.

Suning Tang, et al., "Design Limitations of Highly Parallel Free-Space Optical Interconnects Based on Arrays of Vertical Cavity Surface-Emitting Laser Diodes, Microlenses, and Photodetectors," *Journal of Lightwave Technology*, vol. 12, No. 11, Nov. 1, 1994, pp. 1971-1975.

Cox, et al., "Guided Mode Grating Resonant Filters of VCSEL Applications," *Proceedings of the SPIE*, The International Society for Optical Engineering, Diffractive, and Holographic Device Technologies and Applications V, San Jose, California, vol. 3291, Jan. 28-29, 1998, pp. 70-71.

Martinsson, et al., "Transverse Mode Selection in Large-Area Oxide-Confined Vertical-Cavity Surface-Emitting Lasers Using a Shallow Surface Relief," *IEEE Photonics Technology Letters*, vol. 11, No. 12, Dec. 1999, pp. 1536-1538.

Choquette, eel al., "Lithographically-Defined Gain Apertures Within Selectively Oxidized VCSELs," paper CtuL6, Conference on Lasers and Electro-Optics, San Francisco, California (2000).

Oh, et la. "Single-Mode Operation in Antiquided Vertical-Cavity Surface-Emitting Laser Using a Low-Temperature Grown AlGaAs Dielectric Aperture," *IEEE Photonics Technology Letters*, 10(8), 1064-1066 (1998).

Jewell, et al., "Surface-Emitting Microlasers for Photonic Switching and Interchip Connections," *Optical Engineering*, vol. 29, No., Mar. 1990, pp. 210-214.

G. Shtengel, et al., "High-Speed Vertical-Cavity Surface-Emitting Lasers," *Photonics Technology Letters*, vol. 5, No. 12, Dec. 1993, pp. 1359-1361.

U.S. Appl. No. 09/751,423, filed Dec. 29, 2000, entitled "Spatially Modulated . Reflector for an Optoelectronic Device."

Banwell, et al., "VCSE laser Transmitters for Parallel Data Links," *IEEE Journal of Quantum Electronics*, vol. 29, No. 2, Feb. 1993, pp. 635-644.

Catchmark, et al., "High Temperature CW Operation of Vertical Cavity Top Surface-Emitting Lasers," CLEO 1993, p. 138.

Chemla, et al., "Nonlinear Optical Properties of Semiconductor quantum Wells," *Optical Nonlinearities and Instabilities in Semiconductors*, Academic Press, Inc., copyright 1988, pp. 83-120.

Choa, et al., "High-Speed Modulation of Vertical-Cavity Surface-Emitting Lasers," *IEEE Photonics Technology Letters*, vol. 3, No. 8, Aug. 1991, pp. 691-699.

G.G. Oritz, et al., "Monolithic Integration of In0.2 GA0.8AS Vertical. Cavity Surface-Emitting Lasers with Resonance-Enhanced Quantum Well Photodetectors," *Electronics Letters*, vol. 32, No. 13, Jun. 20, 1996, pp. 1205-1207.

Graf, Rudolph, *Modern Dictionary of Electronics*, 6th ed., Indiana: Howard W. Sams & Company, 1984, p. 694.

Jewell, et al., "Surface Emitting Microlasers for Photonic Switching & Intership Connections," *Optical Engineering*, vol. 29, No. 3, Mar. 1990, pp. 210-214.

Kishino, et al., "Resonant Cavity-Enhanced (RCE) Photodetectors" *IEEE Journal of Quantum Electronics*, vol. 27, No. 8, pp. 2025-2034.

Kuchibhotla, et al., "Low-Voltage High Gain Resonant—Cavity Avalanche Photodiode," *IEEE Photonics Technology Letters*, vol. 3, No. 4, pp. 354-356.

Lai, et al., "Design of a Tunable GaAs/AlGaAs Multiple-Quantum-Well Resonant Cavity Photodetector," *IEEE Journal of Quantum Electronics*, vol. 30, No. 1, pp. 108-114.

Lee, et al., "Top-Surface Emitting GaAs Four-Quantum-Well Lasers Emitting at 0-85 um," *Electronics Letters*, vol. 24, No. 11, May 24, 1990, pp. 710-711.

Miller, et al., "Optical Bistability Due to Increasing Absorption," *Optics Letters*, vol. 9, No. 5, May 1984, pp. 162-164.

Morgan, et al., "200 C, 96-nm Wavelength Range, Continuous-Wave Lasing from Unbonded GaAs MOVPE-Grown Vertical Cavity Surface-Emitting Lasers," *IEEE Photonics Technology Letters*, vol. 7, No. 5, May 1995, pp. 441-443.

Jiang, et al., "High -Frequency Polarization Self-Modulation in Vertical-Cavity Surface-Emitting Lasers," *Applied Physics Letters*, vol. 63, No, 63, Dec. 27, 1993, pp. 2545-2547.

Morgan, et al., "High-Power Coherently Coupled 8x8 Vertical Cavity Surface Emitting Laser Array," *Applied Physics Letters*, vol. 61, No. 10, Sep. 7, 1992, pp. 1160-1162.

Morgan, et al., Hybride Dielectric/AlGaM Mirror Spatially Filtered Vertical Cavity Top-Surface Emitting Laser, *Applied Physics Letters*, vol. 66, No. 10, Mar. 6, 1995, pp. 1157-1559.

Morgan, et al., "Novel Hibrid-DBR Single-Mode Controlled GaAs Top-Emitting VCSEL with Record Low Voltage," 2 pages, date prior to Dec. 29, 2000.

Morgan, et al., "Progress in Planarized Vertical Cavity Surface Emitting Laser Devices and Arrays," *SPIE*, vol. 1562, Jul. 1991, pp. 149-159.

Morgan, et al., "Submilliamp, Low-Resistance, Continuous-Wave, Single-Mode GaAS Planar Vertical-Cavity Surface Emitting Lasers," Honeywell Technology Center, Jun. 6, 1995.

Morgan, et al., "Transverse Mode Control of Vertical-Cavity Top-Surface Emitting lasers," *IEEE Photonics Technology Letters*, vol. 4, No. 4, Apr. 1993, pp. 374-377.

Morgan, et al., "Vertical-Cavity Surface-Emitting Laser Arrays," *SPIE*, vol. 2398, Feb. 1995, pp. 65-93.

Morgan, "High-Performance, Producible Vertical Cavity Lasers for Optical Interconnects," *High Speed Electronics and Systems*, vol. 5, No. 4, Dec. 1994, pp. 65-95.

Nugent, et al., "Self-Pulsations in Vertical-Cavity Surface-Emitting Lasers,"*Electronic Letters*, vol. 31, No. 1, Jan. 5, 1995, pp. 43-44.

U.S. Appl. No. 09/751,422, filed Dec. 29, 2000, entitled "Resonant Reflector for Use with Optoelectronic Devices."

PCT International Search Report on PCT/US 01/49089, the PCT counterpart of this U.S. Patent Application, dated Oct. 1, 2002.

* cited by examiner

TUNABLE DETECTOR

RELATED APPLICATIONS

This application is a continuation, and claims the benefit, of U.S. patent application Ser. No. 10/121,490, entitled RESONANT REFLECTOR FOR INCREASED WAVELENGTH AND POLARIZATION CONTROL, filed Apr. 12, 2002 now U.S. Pat. No. 6,836,501, which, in turn, is a continuation-in-part of U.S. patent application Ser. No. 09/751,422, entitled RESONANT REFLECTOR FOR USE WITH OPTOELECTRONIC DEVICES, filed Dec. 29, 2000 now U.S. Pat. No. 6,782,027. All of the aforementioned patent applications are incorporated herein in their respective entireties by this reference.

BACKGROUND OF THE INVENTION

This invention relates to the field of optoelectronic devices, and more particularly to resonant reflectors for use with optoelectronic devices.

Various forms of optoelectronic devices have been developed and have found widespread use including, for example, semiconductor lasers, semiconductor photodiodes, semiconductor photo detectors, etc. For some of these applications, an optoelectronic emitter such as a semiconductor laser is coupled to an optoelectronic detector (e.g., photodiode or Resonant Cavity Photo Detector) through a fiber optic link or even free space. This configuration can provide a high-speed communication path, which, for many applications, can be extremely beneficial.

The increased use of all-optical fiber networks as backbones for global communication systems has been based in large part on the extremely wide optical transmission bandwidth provided by optical fiber. This has led to an increased demand for the practical utilization of the optical fiber bandwidth, which can provide, for example, increase communication system user capacity. In the prevailing manner for exploiting optical fiber bandwidth, wavelength-division multiplexing (WDM) and wavelength-division demultiplexing (WDD) techniques are used to enable the simultaneous transmission of multiple independent optical data streams, each at a distinct wavelength, on a single optical fiber, with wavelength-selective WDM and WDD control provided for coupling of the multiple data streams with the optical fiber on a wavelength-specific basis. With this capability, a single optical fiber can be configured to simultaneously transmit several optical data streams, e.g., ten optical data streams, that each might not exceed, say, 10 Gb/s, but that together represent an aggregate optical fiber transmission bandwidth of more than, say, 100 Gb/s.

In order to increase the aggregate transmission bandwidth of an optical fiber, it is generally preferred that the wavelength spacing of simultaneously transmitted optical data streams, or optical data "channels," be closely packed to accommodate a larger number of channels. In other words, the difference in wavelength between two adjacent channels is preferably minimized. The desire for closely-spaced optical transmission channels results in the need for fine wavelength resolution, which complicates the wavelength-selective WDM and WDD operations required for simultaneous transmission of the channels. Like WDM, Polarization Division Multiplexing (PDM) can also be used to extend the bandwidth of some optical data channels.

BRIEF SUMMARY OF AN EXEMPLARY EMBODIMENT OF THE INVENTION

In general, exemplary embodiments of the invention are concerned with optical systems that employ guided-mode grating resonant reflector filter ("GMGRF") to facilitate wavelength and/or polarization selectivity in the optical system. In one implementation, an optical system is provided that includes a first tunable detector and a second tunable detector. Each of the tunable detectors includes a GMGRF that is tuned to select a corresponding optical wavelength and/or polarization of an optical data channel. Typically, the optical wavelength and/or polarization of the optical data channel is different as between the first and second tunable detectors. Thus, in some implementations, an array of tunable detectors is employed to collectively select each of the wavelengths and/or polarizations of an optical data signal having a plurality of data channels.

BRIEF DESCRIPTION OF THE DRAWINGS

Other objects of the present invention and many of the attendant advantages of the present invention will be readily appreciated as the same becomes better understood by reference to the following detailed description when considered in connection with the accompanying drawings, in which like reference numerals designate like parts throughout the figures thereof and wherein.

Figure 18:
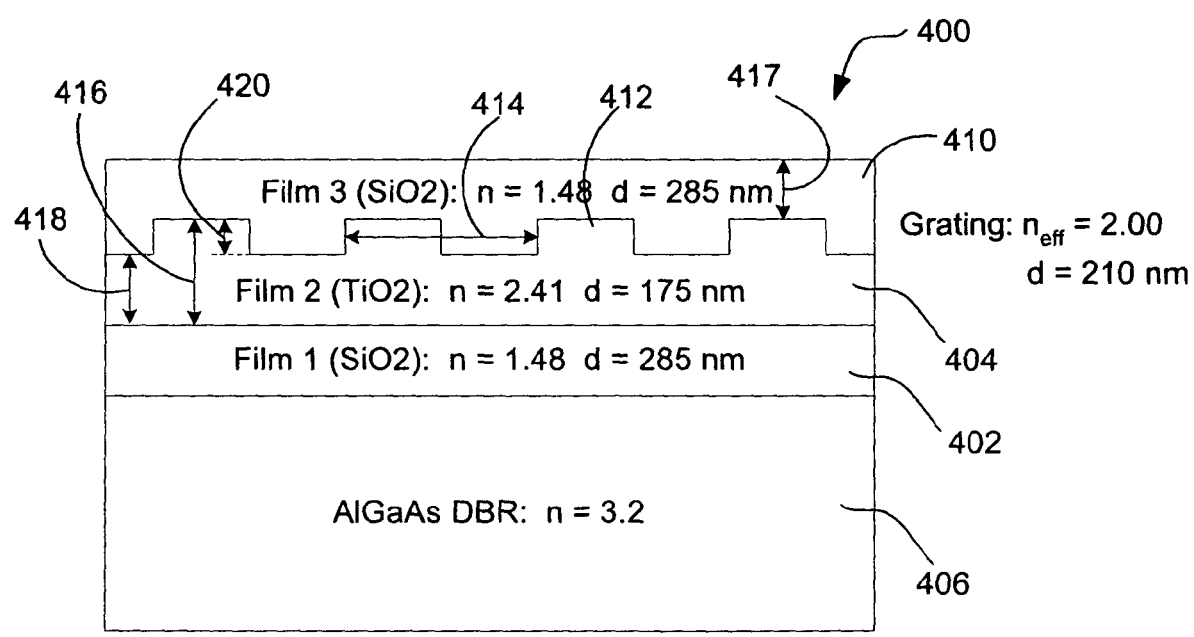
Figure 19:
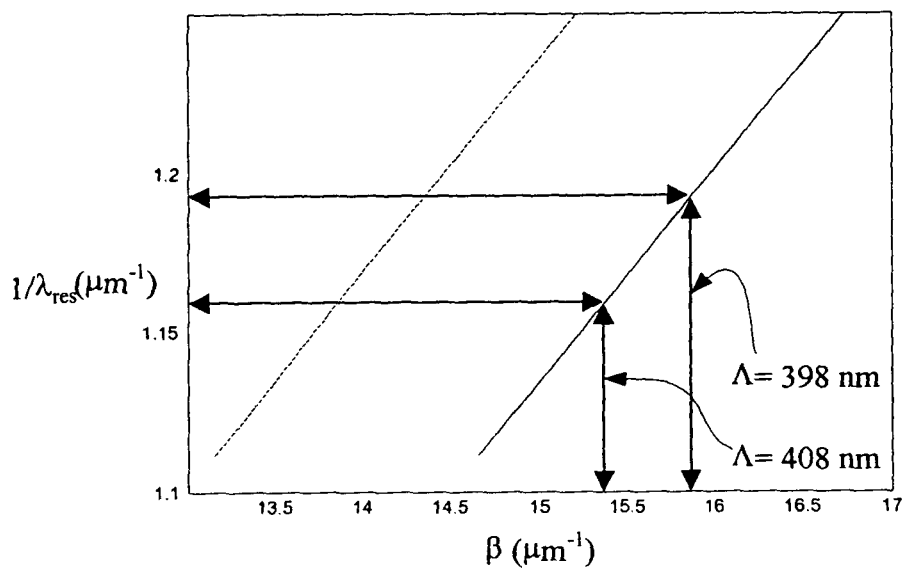
Figure 20:
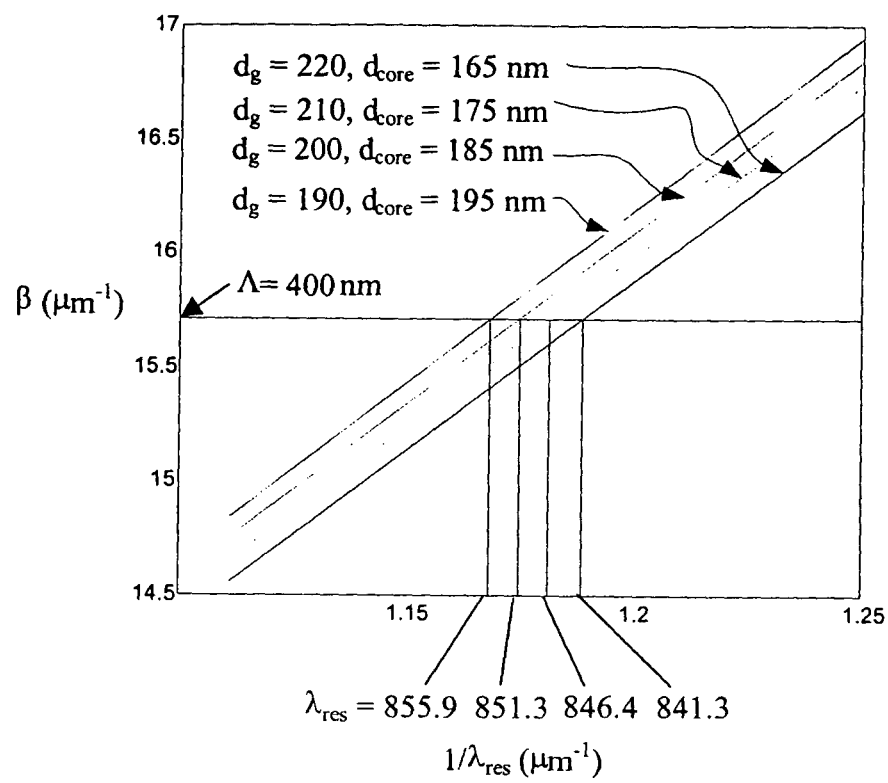

FIG. WDM/WDD is a schematic diagram showing an illustrative GMRGF filter in accordance with the present invention;

FIG. 19 is a graph showing the relationship between grating period ($\Lambda$) and the resonant wavelength for the GMGRF shown in FIG. 18; and FIG. 20 is a graph showing the relationship between the grating height 420/core depth 418 and the resonant wavelength for the GMGRF shown in FIG. 18.

DETAILED DESCRIPTION OF THE PREFERRED EMBODIMENTS

Figure 1:
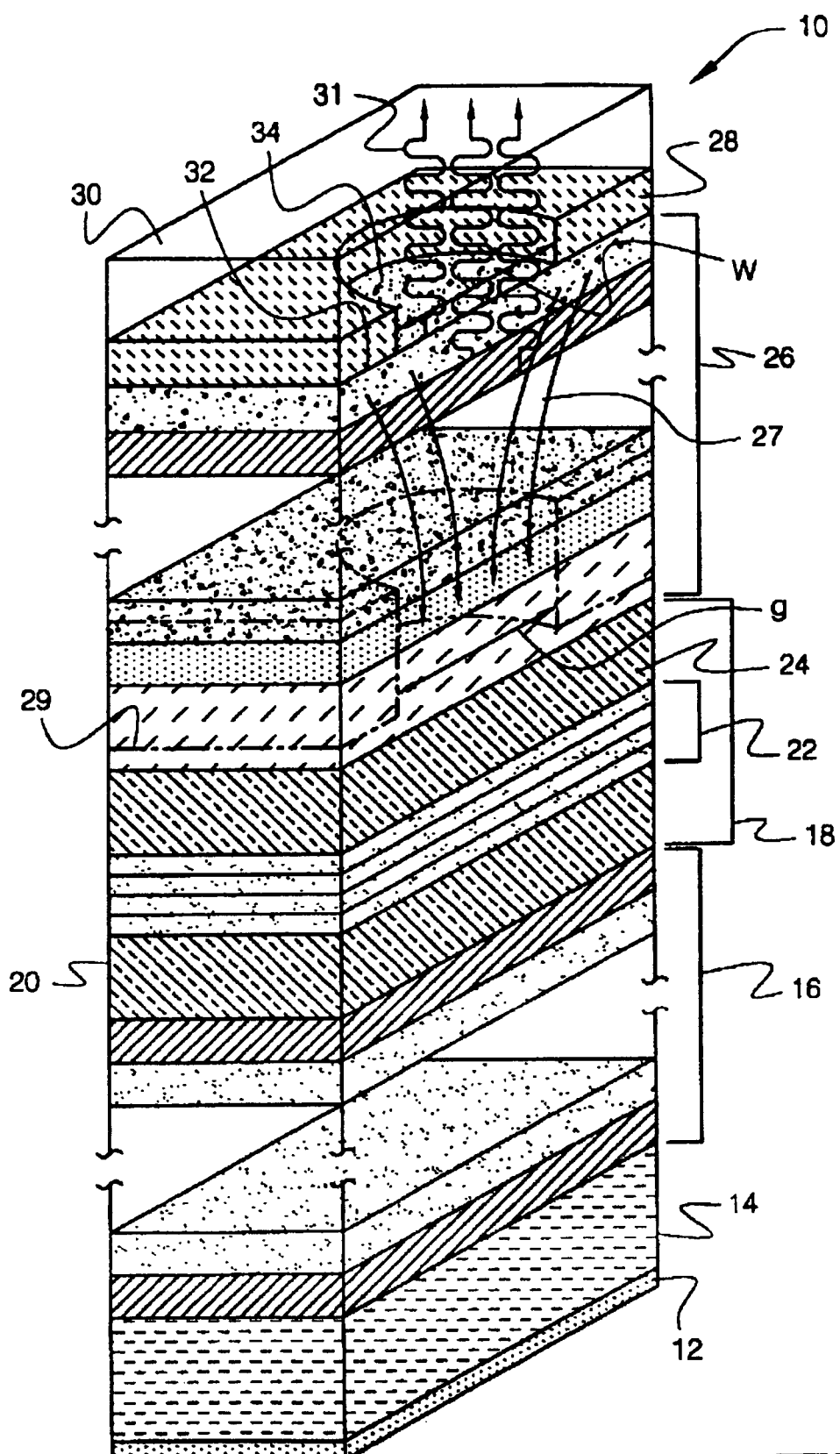
FIG. 1 is a schematic diagram of a planar, current-guided, GaAs/AlGaAs top surface emitting vertical cavity laser in accordance with the prior art.

FIG. 1 is a schematic illustration of a planar, current-guided, GaAs/AlGaAs top surface emitting vertical cavity laser 10 in accordance with the prior art. Formed on an n-doped gallium arsenide (GaAs) substrate 14 is a n-contact 12. Substrate 14 is doped with impurities of a first type (i.e., n type). An n-type mirror stack 16 is formed on substrate 14. Formed on stack 16 is a spacer 18. Spacer 18 has a bottom confinement layer 20 and a top confinement layer 24 surrounding active region 22. A p-type mirror stack 26 is formed on top confinement layer 24. A p-metal layer 28 is formed on stack 26. The emission region may have a passivation layer 30.

Isolation region 29 restricts the area of the current flow 27 through the active region. Region 29 may be formed by deep H+ ion implantation. While a deep H+ implant is provided as an illustration, it is contemplated that any type of current and field confinement may be used, including for example, gain-guided, oxide-confinement, or any other means. The diameter "g" may be set to provide the desired active area, and thus the gain aperture of the VCSEL 10. Further, the diameter "g" may be set by the desired resistance of the p-type mirror stack 26, particularly through the non-conductive region 29. Thus, non-conductive region 29 performs the gain guiding function. The diameter "g" is typically limited by fabrication limitations, such as lateral straggle during the implantation step.

Spacer 18 may contain a bulk or quantum-well active region disposed between mirror stacks 16 and 26. Quantum-well active region 22 may have alternating layers of aluminum gallium arsenide (AlGaAs) barrier layers and GaAs quantum-well layers. InGaAs quantum wells may also be used in the active region, particularly where an emission wavelength (e.g., $\lambda$=980 nm) is desired where GaAs is transparent. Stacks 16 and 26 are distributed Bragg reflector (DBR) stacks, and may include periodic layers of doped AlGaAs and aluminum arsenide (AlAs). The AlGaAs of stack 16 is doped with the same type of impurity as substrate 14 (e.g., n type), and the AlGaAs of stack 26 is doped with the other kind of impurity (e.g., p type).

Metal contact layers 12 and 28 are ohmic contacts that allow appropriate electrical biasing of laser diode 10. When laser diode 10 is forward biased with a more positive voltage on contact 28 than on contact 12, active region 22 emits light 31 which passes through stack 26.

A typical near IR VCSEL requires high reflectivity (>99%). Thus, an all-semiconductor DBR typically requires 20-40 mirror periods with a thickness of 2-4 µm. As such, the epi-structure required for a complete VCSEL, including both top and bottom DBR mirrors surrounding an active spacer region typically includes over 200 layers having a thickness in excess of 7-8 µm.

Figure 2:
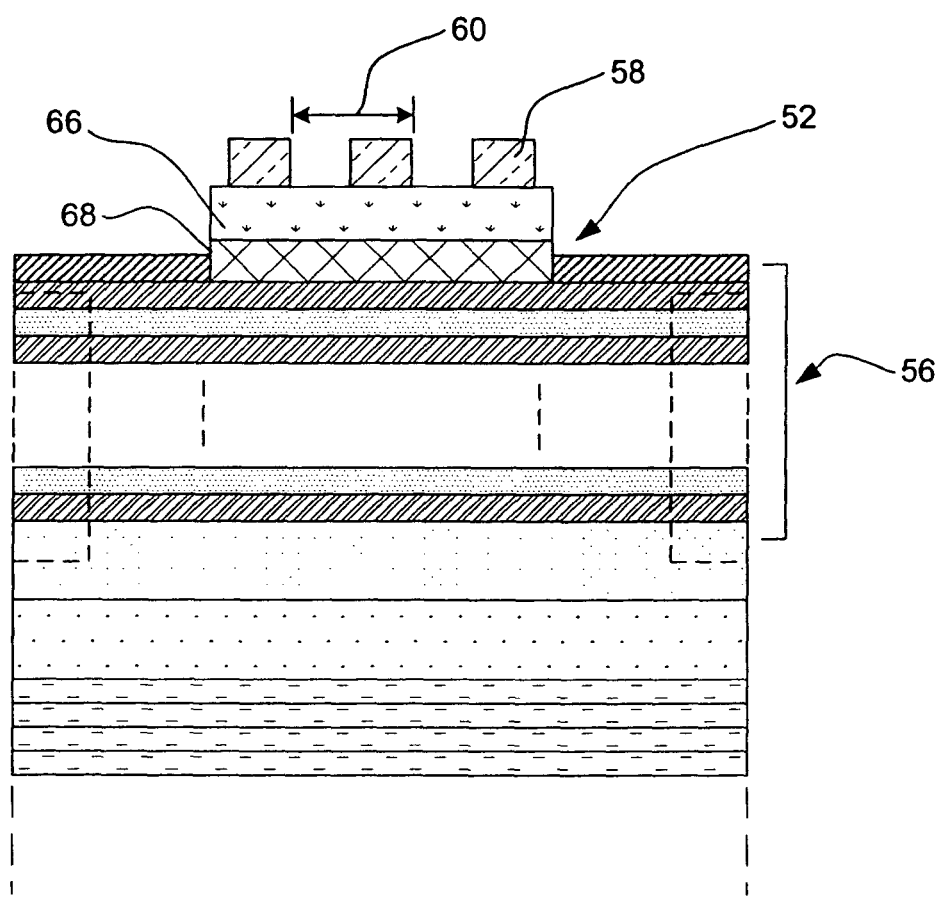
FIG. 2 is a schematic cross-sectional side view of a planar, current-guided, GaAs/AlGaAs top surface emitting vertical cavity laser with an illustrative resonant reflector.

As discussed in U.S. patent application Ser. No. 08/872534, entitled "Resonant Reflector For Improved Optoelectronic Device Performance And Enhanced Applicability", a hybrid mirror structure may be used to reduce the overall mirror thickness. FIG. 2 is a schematic cross-sectional side view of a planar, current-guided, GaAs/AlGaAs top surface emitting vertical cavity laser with a hybrid top mirror including a resonant reflector 52 and a distributed Bragg reflector 56. This device combines the anomalous filtering properties of guided mode resonance in a dielectric waveguide grating with the reflective properties of a conventional DBR mirror.

The hybrid mirror structure includes, for example, a resonant reflector 52 and a DBR mirror 56. Although not explicitly shown, it is contemplated that the bottom mirror may also include a resonant reflector structure, if desired. It is known that a dielectric resonant reflector 52 is highly reflective on resonance, and may be more reflective than a corresponding DBR type mirror at the same wavelength. Thus, by using a hybrid approach, it is contemplated that the number of DBR mirror periods needed for a given reflectance may be reduced.

It is known that lateral straggle effects during ion implantation of the gain guiding region 62 through the DBR mirrors often limits the lateral dimension 64 of the active region to ≥10 µm. This directly impacts the minimum achievable threshold current, single mode operation, and indirectly impacts the speed of the VCSEL. By incorporating a resonant reflector into the top mirror, equivalent or superior reflectance properties in a structure five to ten times thinner may be achieved. This may translate into an ion implant that is more controllable, which may reduce the volume of the active region. A smaller active region may reduce the operating current and power of the device, improve planarity and thus the monolithic integrability of the VCSEL with electronics and smart pixels, and may provide a controllable single mode and single polarization emission with increased modal control.

It is recognized that the hybrid approach of FIG. 2 is compatible with alternate existing gain-guiding techniques including etched pillars (with or without planarization and/or regrowth), lateral oxidation, selective growth, etc. By decreasing the overall thickness of the VCSEL mirrors, the resonant reflector may improve the processibility and performance of the alternate current guiding approaches. While ion implantation is provided as an illustration, it is contemplated that any type of current and field confinement may be used, including for example, gain-guided, oxide-confinement, or any other means.

The resonant reflector 52 of FIG. 2 includes a three layer waveguide-grating structure suitable for use in a near IR VCSEL. The three-layer stack may be designed to function both as an anti-reflection (AR) coating near the emission wavelength for the VCSEL-structure substrate and independently as a guided-mode resonant reflector waveguide-grating (i.e. a guided-mode grating resonant reflector filter or GMGRF).

The three layers of resonant reflector 52 may form an anti-reflective region, which provides little reflectance for at least a predetermined range of wavelengths including a resonant wavelength. The grating multilayer waveguide structure shown at 52 causes the structure to become substantially more reflective, at least at the resonant wavelength.

Alternatively, the three-layer stack 52 may be designed to function both as a high-reflectivity coating for the VCSEL-structure substrate and independently as a guided-mode resonant reflector waveguide-grating. In this embodiment, the three-layer structure 52 forms a highly-reflective mirror region which provides reflectance for at least a predetermined range of wavelengths including a resonant wavelength (e.g., near 980 nm). The overall reflectance of the top mirror, including layers 66 and 68, may be less than that required for lasing. This may be accomplished by, for example, reducing the number of mirror periods in the top DBR mirror 56. Grating layer 58 causes the guided mode resonant reflector structure 52 to become substantially more reflective at least near the resonant wavelength. In either case, the number of DBR mirror layers beneath the resonant reflector 52 may be reduced relative to the conventional VCSEL construction shown in FIG. 1.

Resonance is achieved in the resonance reflector 52 by matching the first-diffraction order wave vector of the grating 58 to the propagating mode of the waveguide 66. Since the latter depends on polarization, the reflectance is inherently polarization-selective. The resonant wavelength is determined primarily by the grating period 60, and the bandwidth is determined primarily by the modulation of the refractive index and fill factor of the grating 58.

Figure 3:
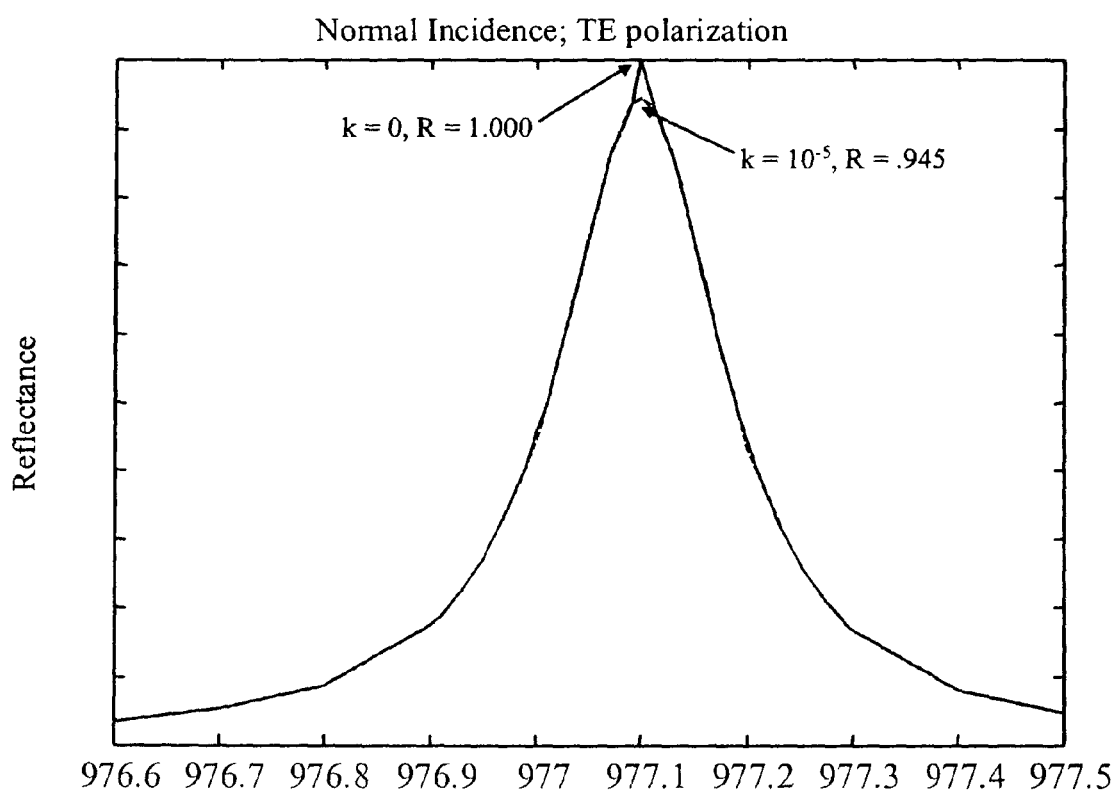
FIG. 3 is a graph showing the reflectivity versus wavelength of the resonant reflector of FIG. 2, both with a non-conductive ($k=0$) waveguide layer and a slightly conductive ($k=10^{-5}$) waveguide layer.

FIG. 3 is a graph showing reflectance curves for a resonant reflector assuming two values for the imaginary component of the refractive index ($k=0$ and $10^{-5}$) in any one layer of the waveguide-grating structure, and $k=0$ in the other two layers. In this example, the top layer, middle layer and bottom layer are formed from Indium Tin Oxide (ITO), GaAs, and AlGaAs, respectively. The refraction indices for the top, middle and bottom layers are 1.96, 3.5 and 3.24, respectively, and the thicknesses of the top, middle and bottom layers are preferably $\lambda/4$, $3\lambda/4$ and $\lambda/4$, respectively. For this measurement, the layers are placed on a substrate with an effective reflective index of 3.2. This structure is simulated to exhibit one transverse Electric (TE) mode resonance (with a polarization parallel to the grating), no perpendicular resonance and a low out of resonant reflectance near $10^{-6}$.

The imaginary component "k" of the refractive index is related to optical absorption and electrical conductivity of the resonant reflector. The case $k=10^{-5}$, which roughly corresponds to the minimum conductivity required to inject current through the resonant reflector, produces about 5 percent absorption. The same three layers, all with $k=0$, indicating a dielectric resonant reflector, produces theoretically 100 percent reflectance.

This graph illustrates the extreme sensitivity of the resonant reflector 52 to absorption, or more generally, to loss of any kind. Thus, to maximize the reflectance provided by the resonant reflector, the absorption (e.g. $k=0$) for each of the layers 58, 66 and 68 should be near zero. This means that the conductivity of the resonant reflector should also be zero (e.g., non-conductive).

Figure 4:
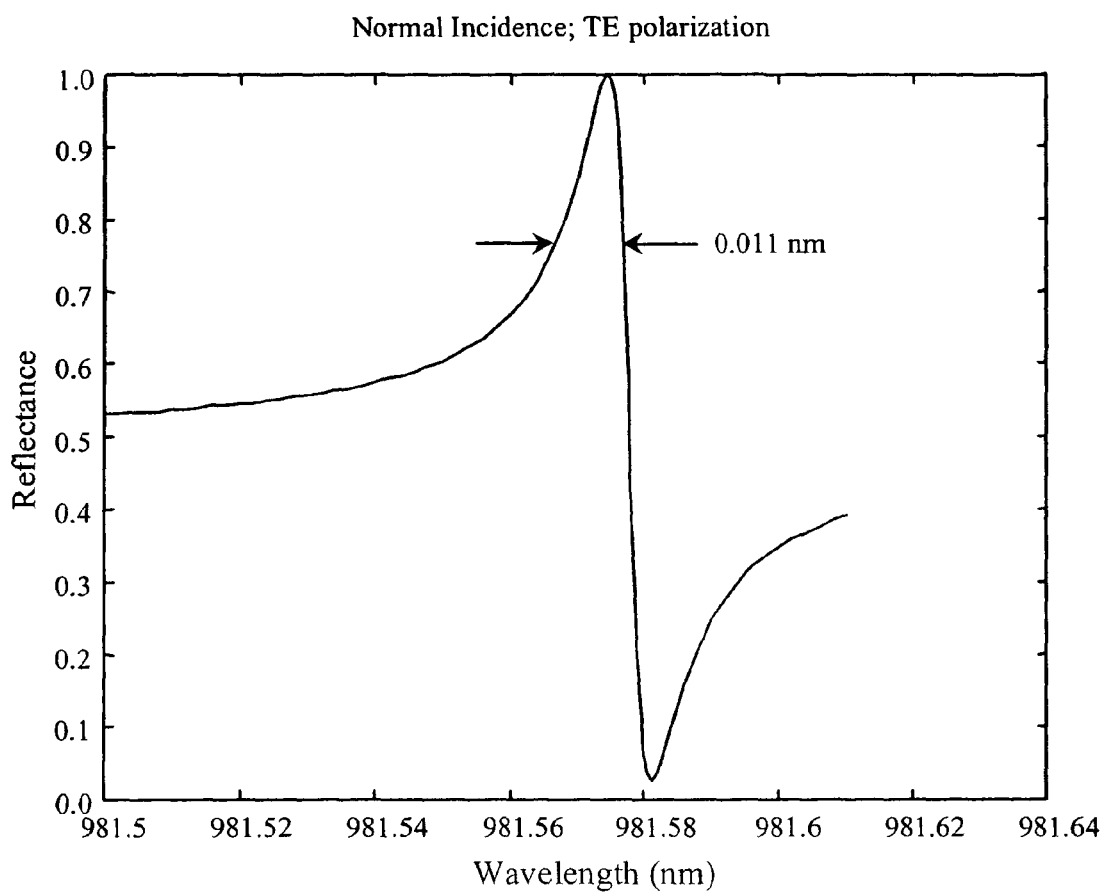
FIG. 4 is a graph showing the reflectance versus wavelength of an all non-conductive ($k=0$) resonant reflector placed adjacent a top mirror that is also non-conductive ($k=0$)
Figure 5:
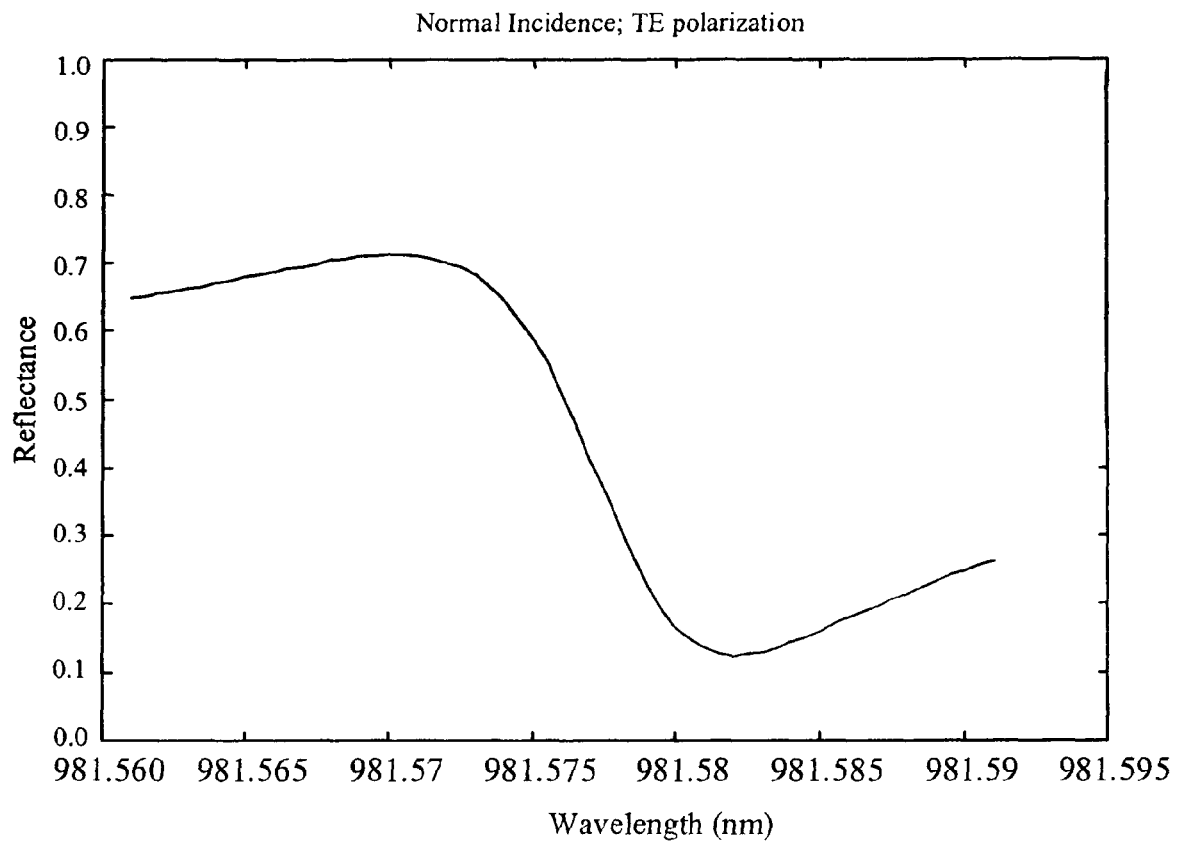
FIG. 5 shows the reflectance versus wavelength of an all non-conductive resonant reflector placed adjacent a top mirror that is slightly conductive ($k=10^{-5}$)

Despite the advantages of using a resonant reflector in conjunction with a DBR mirror stack, it has been found that the reflectivity of the resonant reflector can be limited if not properly isolated from the DBR mirror stack. FIG. 4 is a graph showing the reflectance versus wavelength of an all non-conductive ($k=0$) resonant reflector placed adjacent a top mirror that is also non-conductive ($k=0$). The reflectance curve has a narrow bandwidth, and reaches about 100% reflectivity at the resonant wavelength. In contrast, FIG. 5 shows the reflectance versus wavelength of an all non-conductive resonant reflector placed adjacent a top mirror that is slightly conductive ($k=10^{-5}$). As can be seen, having an adjacent top mirror that is slightly conductive significantly degrades the performance of the resonant reflector. Too much energy in the guided-mode in the waveguide overlaps into the lossy, conductive DBR films of the optoelectronic device.

To overcome this and other difficulties, the present invention contemplates isolating the resonant reflector from adjacent conducting layers. Isolation is preferably accomplished by providing a non-conductive (e.g. dielectric) buffer or cladding layer between the resonant reflector and the adjacent conducting layer of the optoelectronic device. The non-conductive cladding or buffer layer is preferably sufficiently thick, and/or has a sufficiently low refractive index relative to the refractive index of the waveguide of the resonant reflector, to substantially prevent energy in the evanescent tail of the guided mode in the waveguide from entering the adjacent conductive layer of the optoelectronic device. In a preferred embodiment, the waveguide is formed from a dielectric that has a higher refractive index than the refractive index of the buffer or cladding layer, and also higher than the average refractive index of the grating. The thickness of the waveguide preferably depends on the refractive index difference between the waveguide and the buffer or cladding layer.

Figure 6:
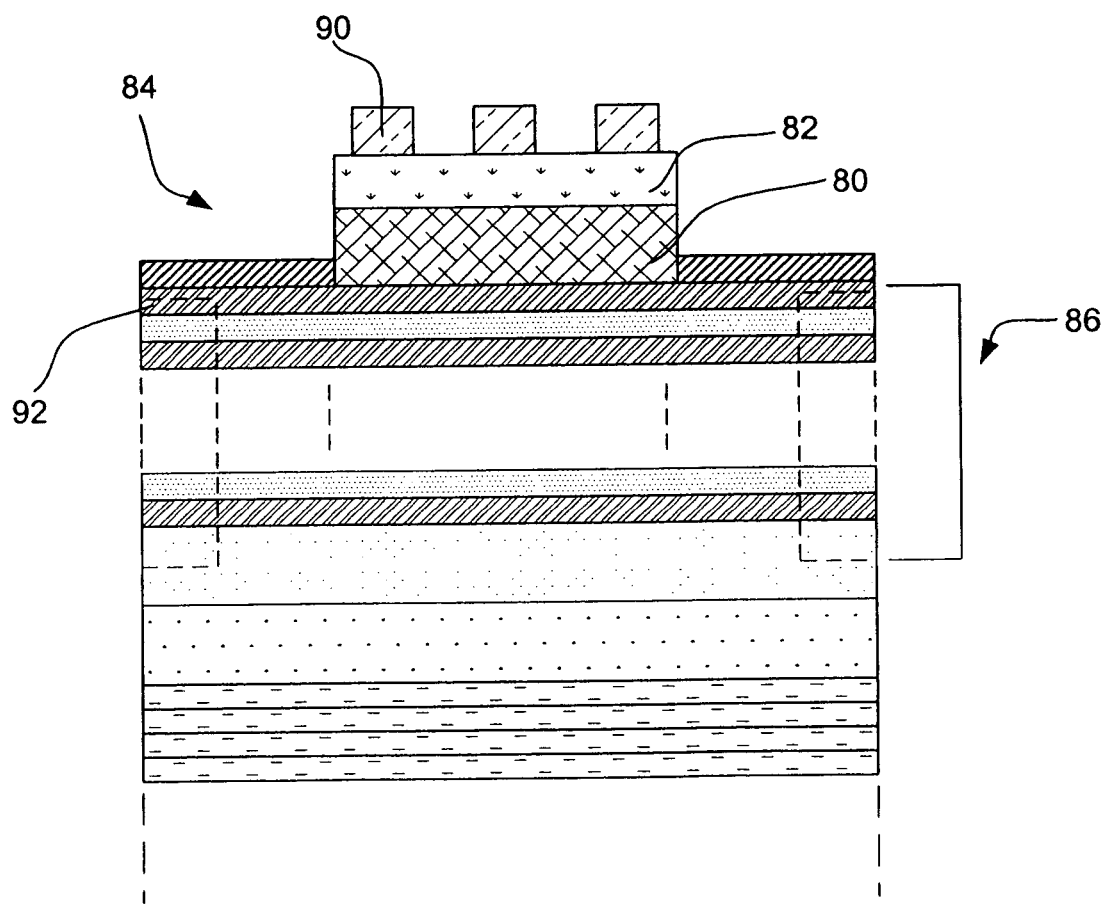
FIG. 6 is a schematic cross-sectional side view of a planar, current-guided, GaAs/AlGaAs top surface emitting vertical cavity laser with a cladding or buffer layer interposed between the waveguide layer of the resonant reflector and the top DBR mirror.

FIG. 6 is a schematic cross-sectional side view of a planar, current-guided, GaAs/AlGaAs top surface emitting vertical cavity laser with a cladding or buffer layer 80 interposed between the waveguide layer 82 of the resonant reflector 84 and the top DBR mirror 86. As indicated above, the cladding or buffer layer 80 is preferably sufficiently thick, and/or has a sufficiently low refractive index relative to the refractive index of the waveguide of the resonant reflector, to substantially prevent energy in the evanescent tail of the guided mode in the waveguide from entering an adjacent conductive layer of the optoelectronic device.

In the illustrative embodiment, the grating layer 90 is $SiO_2$ with an index of refraction of about 1.484 and a thickness of 0.340 μm. The waveguide layer 82 may be GaAs with an index of refraction of 3.523 and a thickness of 0.280 μm. Alternatively, the waveguide may be a ternary compound such as $Al_xGa_{1-x}As$, with x close to one, or a high refractive index dielectric such as $TiO_2$, $ZrO_2$, $HfO_2$, or $Si_3N_4$. The thickness of the waveguide preferably depends on the refractive index difference between the waveguide and the buffer or cladding layer. The cladding or buffer layer 80 in the illustrative embodiment is AlO, with an index of refraction of 1.6 and a thickness of 0.766 μm. Finally, the top DBR mirror layer 92 may be AlGaAs with an index of refraction of 3.418 and a thickness of 0.072 μm. In this embodiment, the cladding or buffer layer 80 has an increased thickness and a reduced index of refraction relative to the embodiment shown in FIG. 2, both of which help prevent energy in the evanescent tail of the guided mode in the waveguide layer 82 from entering the top DBR mirror layer 92. It is contemplated however, that similar results may be achieved by either increasing the thickness or reducing the index of refraction of the cladding or buffer layer 80, if desired.

As indicated above, the cladding or buffer layer 80 may be AlO, which has a relatively low refractive index. In one method, this can be accomplished by initially forming the cladding or buffer layer 80 with AlGaAs, with a relatively high concentration of aluminum (e.g. >95%). AlGaAs has a relatively high index of refraction. Then, the waveguide layer 82 and grating layer 90 are provided. The cladding or buffer layer 80, waveguide layer 82 and grating 90 may then be removed around the periphery of the desired optical cavity. Contacts 93 may then be deposited on the exposed top mirror 86 to provide electrical contact to the top mirror. Then, the device may be subject to an oxidizing environment, which oxidizes the AlGaAs material of the cladding or buffer layer 80, resulting in AlO which has a relatively low refractive index. The AlGaAs material is preferably oxidized laterally in from the exposed edges of the cladding or buffer layer 80.

Figure 7:
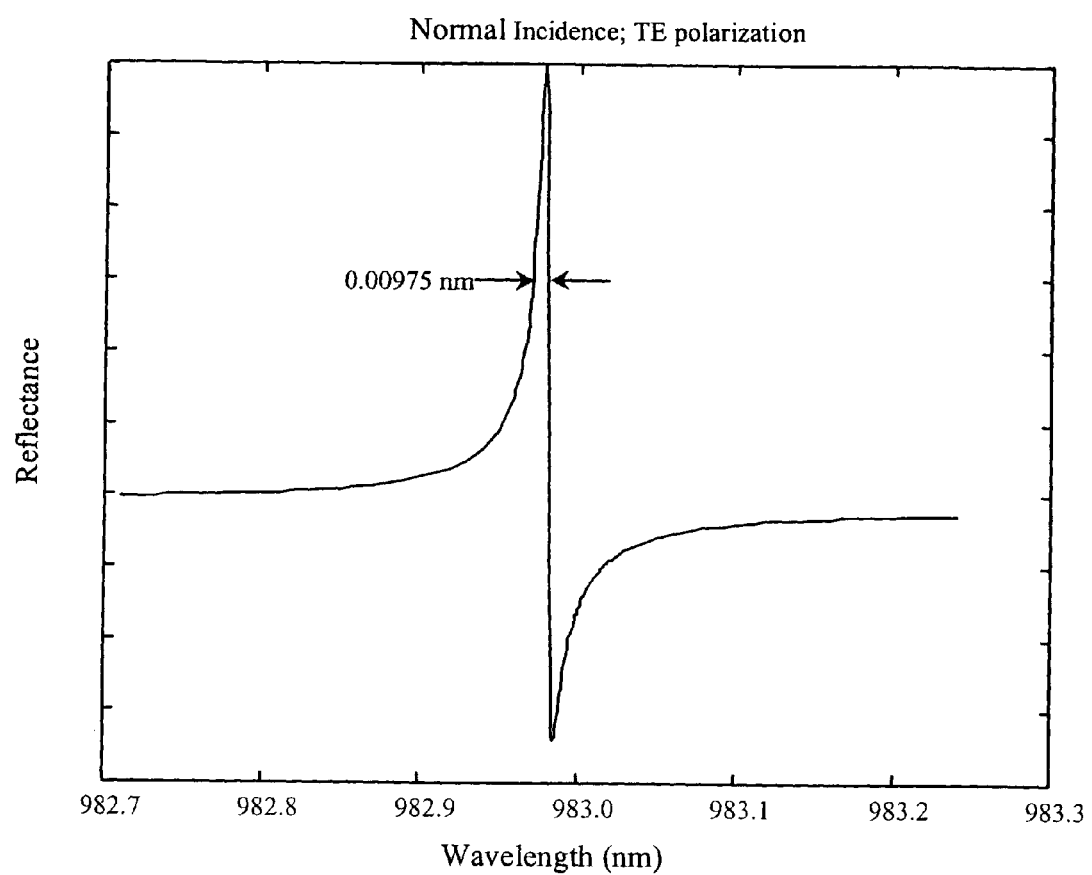
FIG. 7 is a graph showing the reflectance versus wavelength of the resonant reflector of FIG. 6 when the top layers of the top DBR mirror 86 are non-conductive ($k=0$)
Figure 8:
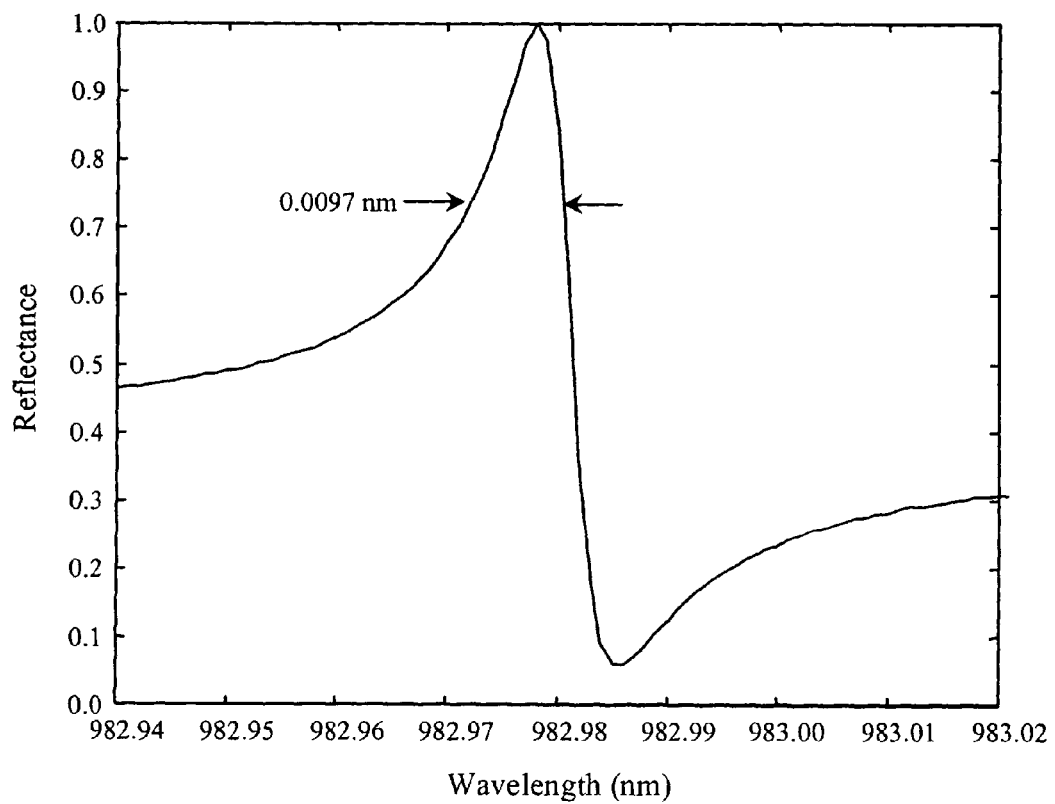
FIG. 8 is a graph showing the reflectance versus wavelength of the resonant reflector of FIG. 6 when the top layers of the top DBR mirror 86 are slightly conductive ($k=10^{-5}$)

FIG. 7 is a graph showing the reflectance versus wavelength of the resonant reflector of FIG. 6 when the top layers of the top DBR mirror 86 are non-conductive (k=0). The reflectance curve has a narrow bandwidth (0.00975 nm), and theoretically reaches 100% reflectivity at the resonant wavelength. FIG. 8 is a graph showing the reflectance versus wavelength of the resonant reflector of FIG. 6 when the top layers of the top DBR mirror 86 are slightly conductive (k=$10^{-5}$). As can be seen, the reflectance curve still has a narrow bandwidth (0.0097 nm), and theoretically reaches 100% reflectivity at the resonant wavelength. Therefore, and unlike FIG. 5, there is little or no degradation in the observed reflectance of the resonant reflector, even when placed adjacent a conductive layer.

Figure 9:
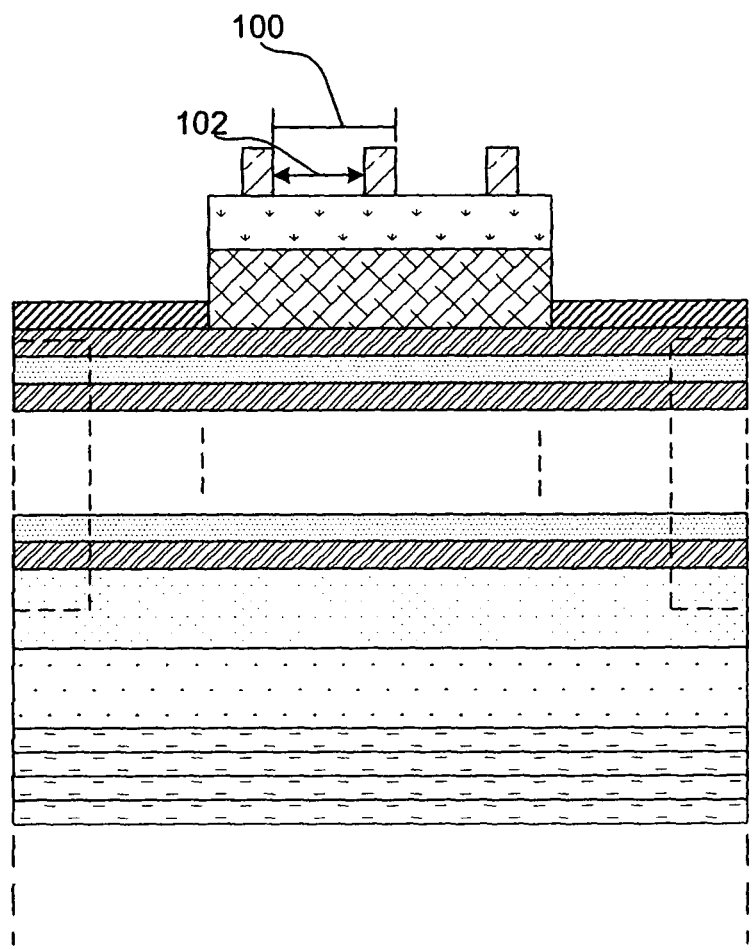
FIG. 9 is a schematic cross-sectional side view of a top surface emitting vertical cavity laser similar to that shown in FIG. 6, but with a modified grating fill factor.

FIG. 9 is a schematic cross-sectional side view of a top surface emitting vertical cavity laser similar to that shown in FIG. 6, but with a modified grating fill factor. The grating fill factor is defined as the grating spacing 102 divided by the grating period 100. The resonant wavelength of a resonant reflector is often determined by the grating period 100, and the spectral bandwidth is often determined by the modulation of the refractive index and fill factor of the grating.

Figure 10:
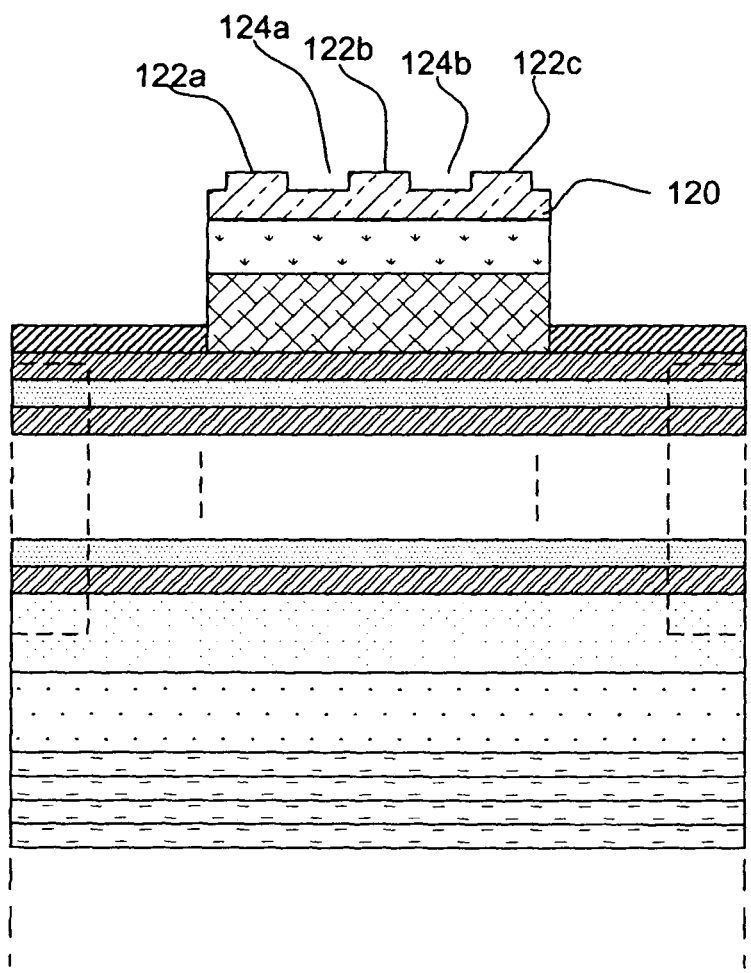
FIG. 10 is a schematic cross-sectional side view of a top surface emitting vertical cavity laser similar to that shown in FIG. 6, but with a grating film that has a controlled etch depth.

When the grating is formed from an oxide such as $SiO_2$, the modulation of the refractive index is related to the difference between the dielectric constants of the grating material and the material that fills the spaces between the grating elements, divided by the average dielectric constant across the grating. The average dielectric constant across the grating can be changed by varying the fill factor of the grating. For example, and assuming a constant grating period, the grating fill factor can be increased by reducing the width of each grating element. A limitation of achieving a desired spectral bandwidth of a resonant reflector by altering the grating fill factor is that the design rules of many manufacturing processes limit the minimum width of the grating elements. Thus, to achieve some spectral bandwidths, the design rules may have to be pushed, which may reduce the manufacturing yield for the devices. FIG. 10 is a schematic cross-sectional side view of a top surface emitting vertical cavity laser similar to that shown in FIG. 6, but with a grating film that has a controlled etch depth to control the spectral bandwidth of the resonant reflector. Like above, a grating film 120 is provided and subsequently etched to form two or more spaced grating regions 122a-122c separated by one or more spaced etched regions 124a-124b. However, rather than etching all the way through the grating film 120 to achieve a desired grating fill factor, and thus a desired spectral bandwidth, the depth of the etch is controlled. By controlling the depth of the etch, a desired average dielectric constant across the grating can be achieved. A benefit of this approach is that the grating width and grating spacing may be optimized to the design rules of the manufacturing process, and the etch depth can be controlled to achieve the desired spectral bandwidth. For example, a fill factor of about 50% is preferred. This may increase the producibility and yield of the resonant reflector.

Figure 11:
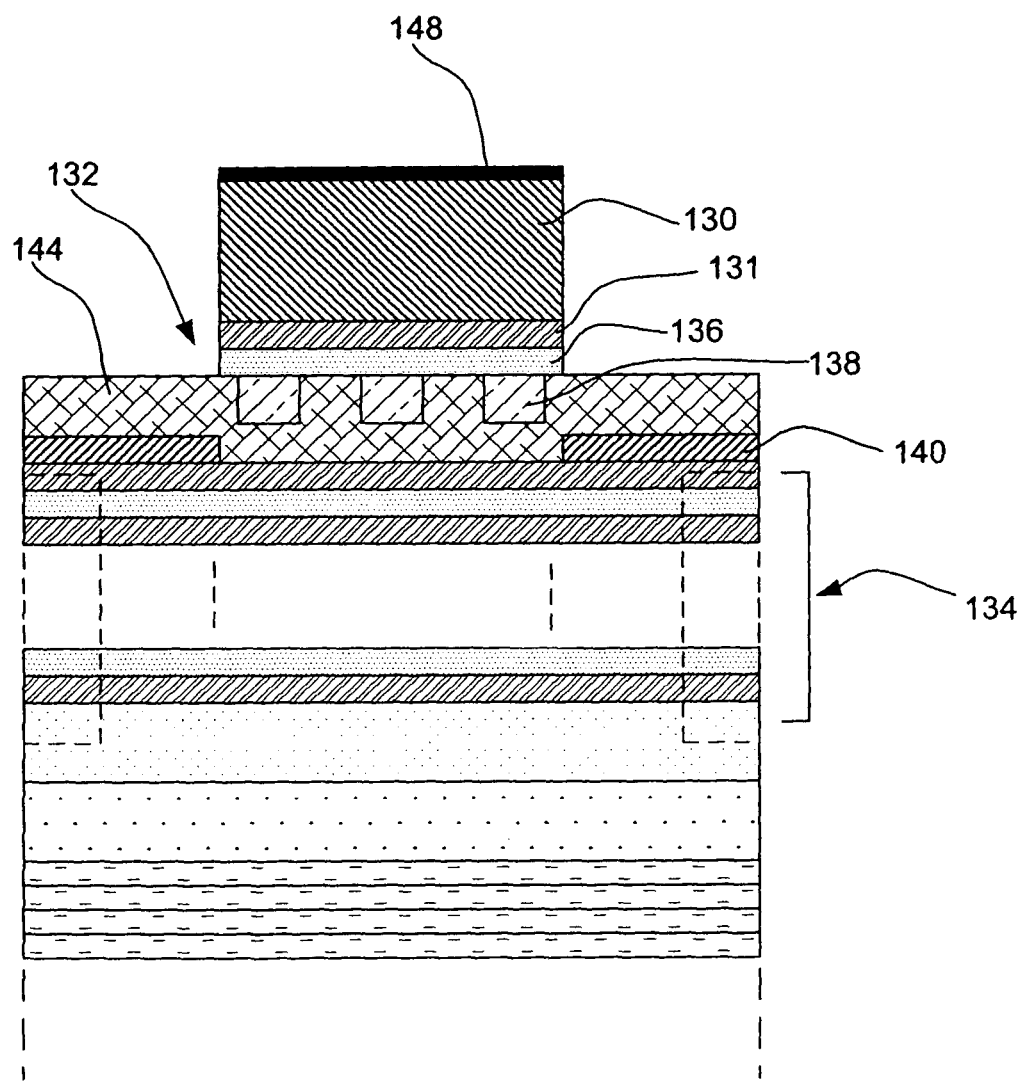
FIG. 11 is a schematic cross-sectional side view of a vertical cavity surface emitting laser that is formed by bonding a resonant reflector that was prepared on a first substrate to the top mirror of the vertical cavity surface emitting laser that was prepared on a second substrate.

FIG. 11 is a schematic cross-sectional side view of a vertical cavity surface emitting laser that is formed by bonding a resonant reflector 132 that is prepared on a first substrate 130 to a top mirror 134 of a vertical cavity surface emitting laser that is prepared on a second substrate. In accordance with this embodiment, a resonant reflector is formed on a front side 131 of a first substrate 130. This includes forming at least a waveguide 136 and a grating 138, as shown. Then, at least a portion of an optoelectronic device, such as a vertical cavity surface emitting laser or resonant cavity photodetector, is prepared on a front side of a second substrate. In FIG. 11, this includes a bottom DBR mirror, an active region, a top DBR mirror 134, and one or more contacts 140.

Thereafter, the front side of the first substrate 130 is bonded to the front side of the second substrate to complete the optoelectronic device. The first substrate 130 may be bonded to the second substrate using an optical epoxy 144, and preferably a non-conductive optical epoxy. The optical epoxy is preferably sufficiently thick, or has a sufficiently low refractive index relative to the refractive index of the waveguide 136 of the resonant reflector 132, so that the energy from the evanescent wave vector in the waveguide 136 is substantially prevented from entering the optoelectronic device on the first substrate. A anti-reflective coating 148 may be applied to the backside of the first substrate 130 as shown.

It is recognized that the relative position of the waveguide 136 and grating 138 may be changed. For example, and as shown in FIG. 11, the grating may be positioned more toward the front side of the first substrate than the waveguide. Alternatively, however, the waveguide may be positioned more toward the front side of the first substrate than the grating, if desired.

Figure 12:
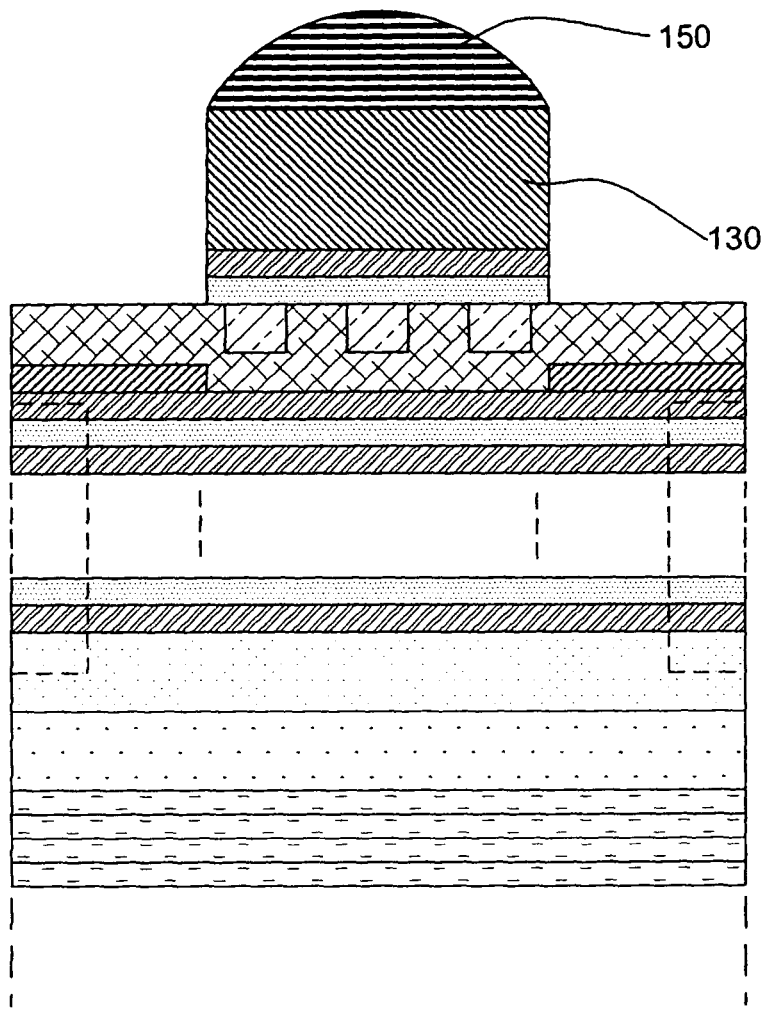
FIG. 12 is a schematic cross-sectional side view of the vertical cavity surface emitting laser of FIG. 11 with a microlens positioned on the backside of the substrate that has the resonant reflector formed thereon.

FIG. 12 is a schematic cross-sectional side view of the vertical cavity surface-emitting laser of FIG. 11 with a microlens 150 positioned on the backside of the first substrate 130. For top emitting devices, a microlens such as a collimating microlens may be formed on the backside of the first substrate 130. For back emitting devices, a collimating microlens may be formed on the backside of the substrate that carries the bottom mirror, the active region and the top mirror of the optoelectronic device. In either case, the collimating microlens 150 is preferably placed in registration with the output of the optoelectronic device as shown.

Figure 13:
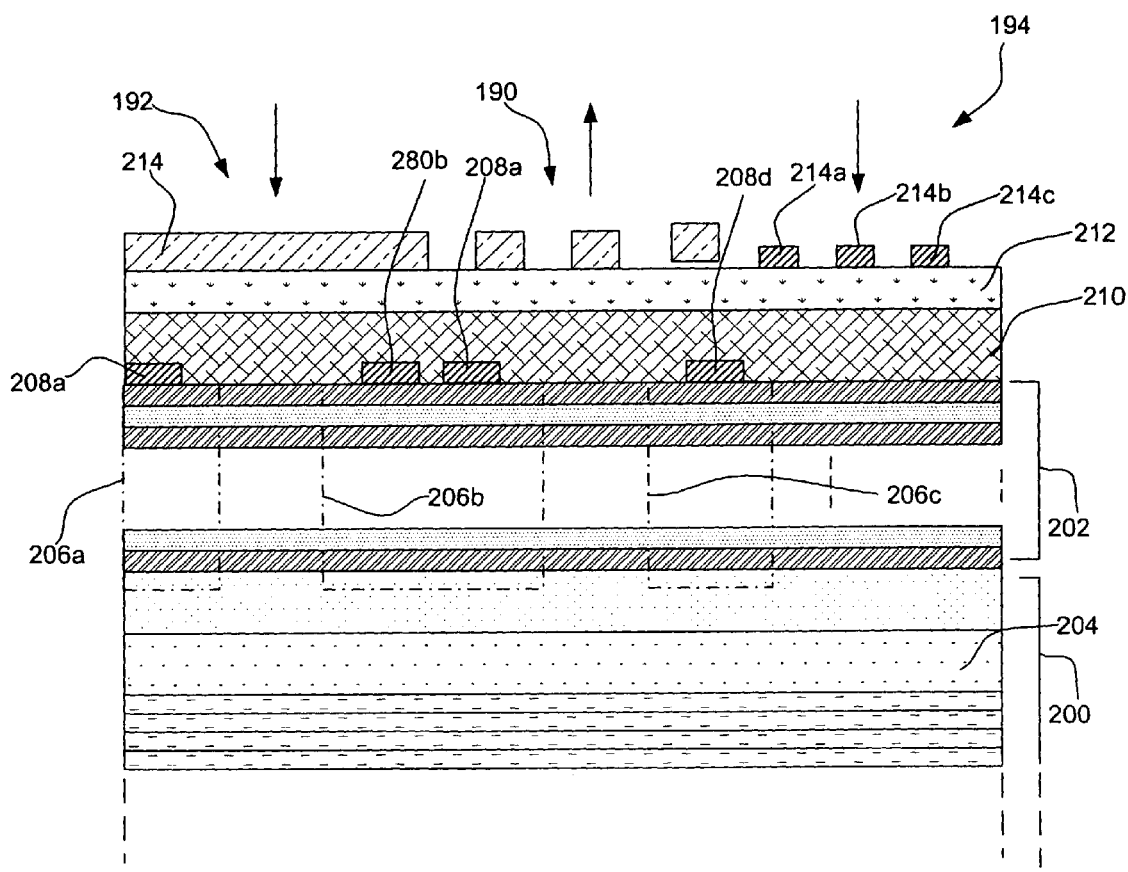
FIG. 13 is a schematic cross-sectional side view of an illustrative monolithic substrate having a RCPD, a VCSEL and a MSM.

It is contemplated that a number of optoelectronic devices may be formed on a common substrate, as shown in FIG. 13. One application for such a configuration is a monolithic transceiver that includes one or more light emitting devices 190 and one or more light receiving devices 192 and 194. In this illustrative embodiment, both the light emitting and light receiving devices are formed on a common substrate (not shown). In one example, a bottom mirror is first formed on the common substrate. The bottom mirror may serve as the bottom mirror for more than one of the optoelectronic devices 190, 192 and 194, and is preferably a DBR mirror stack that is doped to be at least partially conductive. An active region 200 is then formed on the bottom mirror, followed by a top mirror 202. Like the bottom mirror, the top mirror 202 is preferably a DBR mirror stack, and is doped to be the opposite conductivity type of the bottom mirror. The active region 200 may include cladding layers 204 on either side of the active region 200 to help focus the light energy and current in the active region.

A deep H+ ion implant, as shown at 206a-206c, may provide gain guide apertures for selected optoelectronic devices, and may further electrically isolate adjacent devices from one another. While a deep H+ implant is provided as an illustration, it is contemplated that any type of current and field confinement may be used, including for example, gain-guided, oxide-confinement, or any other means. Contacts 208a-208d may be provided on the top mirror 202 and on the bottom surface of the common substrate to provide electrical contact to each of the optoelectronic devices.

Next, a cladding or buffer layer 210 may be provided above the top mirror 202. A resonant reflector may then be provided on top of the cladding or buffer layer 210. The resonant reflector may include a waveguide 212 and a grating film 214. For some optoelectronic devices, such as top emitting devices 190, the grating film 214 may be etched to form a grating, as shown. The grating may substantially increase the reflectivity of the resonant reflector in those regions. For other optoelectronic devices, such as top receiving devices 192, the grating film may either include a different grating structure (e.g., wider spectral bandwidth), or remain non-etched as shown. This may reduce the reflectivity of the resonant reflector, thereby allowing light to more easily enter the optical cavity. For yet other optoelectronic devices, such as Metal-Semiconductor-Metal (MSM) receiving devices 194, the grating film may be removed altogether, and a metal grid 214a-214c may be formed on the waveguide layer 212 or cladding or buffer layer 210, as desired.

To isolate the resonant reflector from the optoelectronic devices, and in particular the conductive top mirror 202, the cladding or buffer layer 210 may be sufficiently thick to substantially prevent energy in the evanescent tail of the guided mode in the waveguide 212 from entering the top mirror 202. Alternatively, or in addition, the cladding or buffer layer 210 may be formed from a material that has a sufficiently low refractive index relative to the refractive index of the waveguide 212 to substantially prevent energy in the evanescent tail of the guided mode in the waveguide 212 from entering the top mirror 202.

Implementation of the described resonant reflector optoelectronic structures will permit polarization, emission wavelength and mode control. These structures and properties can be designed and fabricated using techniques such as lithography or holography, and may not be subject to growth thickness variations alone. The above techniques can be applied to produce, for example, VCSELs with high power single-mode/polarization emission from apertures exceeding a few microns in diameter. Furthermore, wavelength and/or polarization variation across a chip, array or wafer can be used for spatially varied wavelength/polarization division multiplexing, multi-wavelength spectroscopy, etc.

Figure 14:
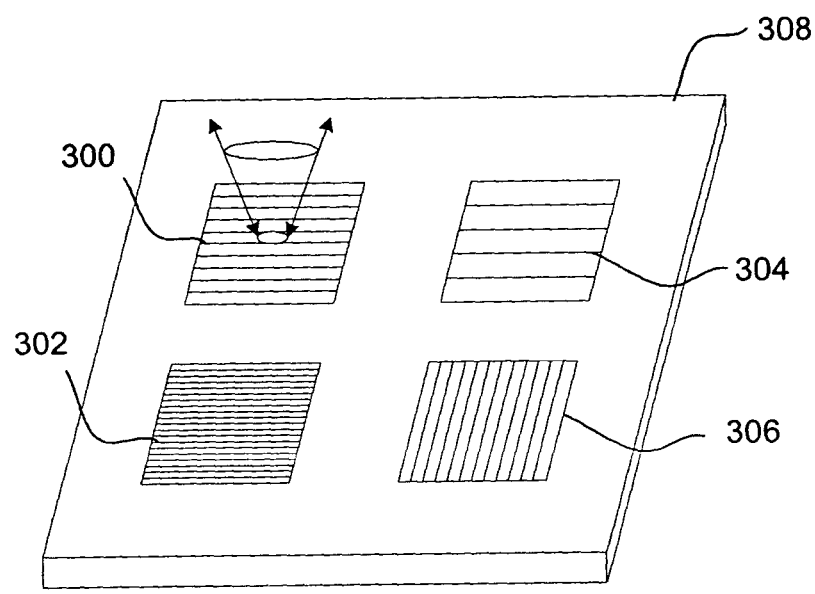
FIG. 14 is a schematic diagram of a number of illustrative optoelectronic emitters that have GMRGF filters for data/telecommunication, processing, switching, etc., including embodiments conducive for wavelength division multiplexing, polarization division multiplexing, and space division multiplexing.

FIG. 14 is a schematic diagram of a number of illustrative optoelectronic emitters that have a guided-mode resonant reflector waveguide-grating (i.e. a guided-mode grating resonant reflector filter or GMRGF) for data/telecommunication, processing, switching, etc., including embodiments conducive for wavelength division multiplexing, polarization division multiplexing, space division multiplexing, etc. The illustrative optoelectronic emitters are shown at 300, 302, 304 and 306, respectively, and in the illustrative embodiment are monolithically formed on a common substrate 308. Each optoelectronic emitter includes a GMRGF filter integrated with or adjacent to the top mirror of the emitter. In one embodiment, the optoelectronic emitters are VCSEL devices.

The GMGRF of each emitter includes a waveguide and a grating. The various gratings are shown using parallel lines in FIG. 14, with each grating having different characteristics. For example, a first optoelectronic emitter 300 includes a grating that extends in a horizontal direction and has a first grating period. The grating direction helps determine the polarization direction of the light that is resonantly reflected by the GMGRF. The grating period may help determine the resonant wavelength of the GMGRF. Thus, the output emission may be inherently wavelength selective.

A second optoelectronic emitter is shown at 302. Optoelectronic emitter 302 includes a grating that also extends in a horizontal direction, but has a second grating period. Thus, the second optoelectronic emitter 302 may produce light that is polarized in the same direction as the first optoelectronic emitter 300. However, the narrower grating period may produce a shorter wavelength than the first optoelectronic emitter 300.

A third optoelectronic emitter is shown at 304. Optoelectronic emitter 304 includes a grating that also extends in a horizontal direction, but has a third grating period. Thus, the third optoelectronic emitter 304 produces light that is polarized in the same direction as the first and second optoelectronic emitters. However, the larger grating period may produce a longer wavelength than the first and second optoelectronic emitters.

Finally, a fourth optoelectronic emitter is shown at 306. Optoelectronic emitter 306 includes a grating that also extends in a perpendicular direction to that of the other optoelectronic emitters 300, 302 and 304. Thus, the fourth optoelectronic emitter 306 produces light that is polarized in a direction that is perpendicular to that of the other optoelectronic emitters 300, 302 and 304.

As can readily be seen, changing the period and/or direction of the grating may allow designers to control lithographically both the operating wavelength and polarization direction of the corresponding optoelectronic emitter devices. This may allow for SDM/WDM/PDM architectures having distributed wavelength and polarization modes. If the admission of light having any polarization is desired, the GMGRF may be fabricated with two crossed gratings aligned orthogonally with each other (e.g. bi-gratings).

As indicated above, the use of a GMGRF reflector can reduce the number of top DBR mirror periods when compared to an all-epitaxial DBR VCSEL or RCPD device. Reducing the number of DBR mirror periods can reduce the overall thickness of the device, which can lead to greater amenability to integration. Increased planarity and the utilization of standard semiconductor planar batch fabrication processes may also help improve producibility. The capability to readily control the wavelength, angular and bandwidth properties of the GMGRF reflector can provide greater flexibility in the construction of multi-element integrated circuits.

Figure 15:
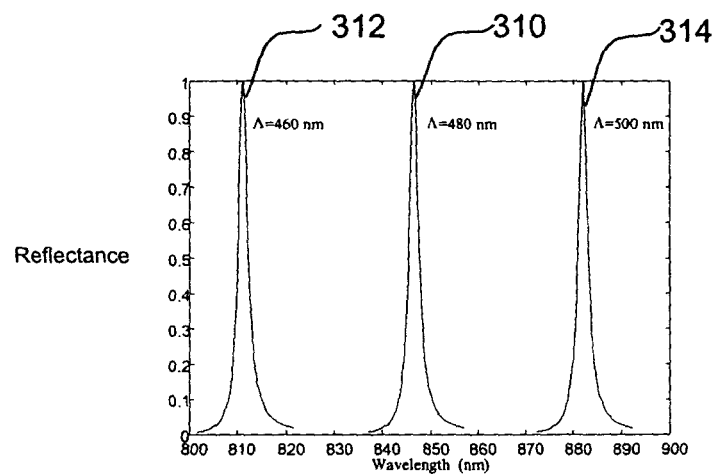
FIG. 15 is a graph showing reflectance versus wavelength for the three illustrative GMRGF filters of FIG. 14 that have a common polarization direction.

FIG. 15 is a graph showing reflectance versus wavelength for the three GMRGF filters 300, 302 and 304 of FIG. 14. Curves 310, 312 and 314 correspond to the GMGRF reflectance versus wavelength for optoelectronic devices 300, 302 and 304, respectively. In the illustrative embodiment, the grating period ($\Lambda$) of the first optoelectronic device 300 is 480 nm, which in the example shown, results in a peak reflectance at a wavelength of about 843 nm. The grating period ($\Lambda$) of the second optoelectronic device 302 is 460 nm, which in the example shown, results in a peak reflectance at a wavelength of about 811 nm. Finally, the grating period ($\Lambda$) of the third optoelectronic device 304 is 500 nm, which in the example shown, results in a peak reflectance at a wavelength of about 882 nm. The reflectance versus wavelength of the fourth optoelectronic device 306 is not shown in FIG. 15.

As described above, the number of DBR mirror periods of the top mirror of a VCSEL or RCPD device may be reduced, preferably so that resonance cannot readily be established without the additional reflectance provided by the GMGRF. In the illustrative embodiment, and referring to FIG. 15, the reflectance provided the GMGRF varies from near zero to near 100%, depending on the wavelength. Therefore, unique wavelength and/or polarization selectively may be provided for each optoelectronic device 300, 302, 304 and 306 by selecting appropriate parameters for the corresponding GMGRF. In this configuration, the resonant wavelength of the GMGRF may help determine, to a large extent, the cavity resonance wavelength and/or polarization of the corresponding optoelectronic device.

Figure 16:
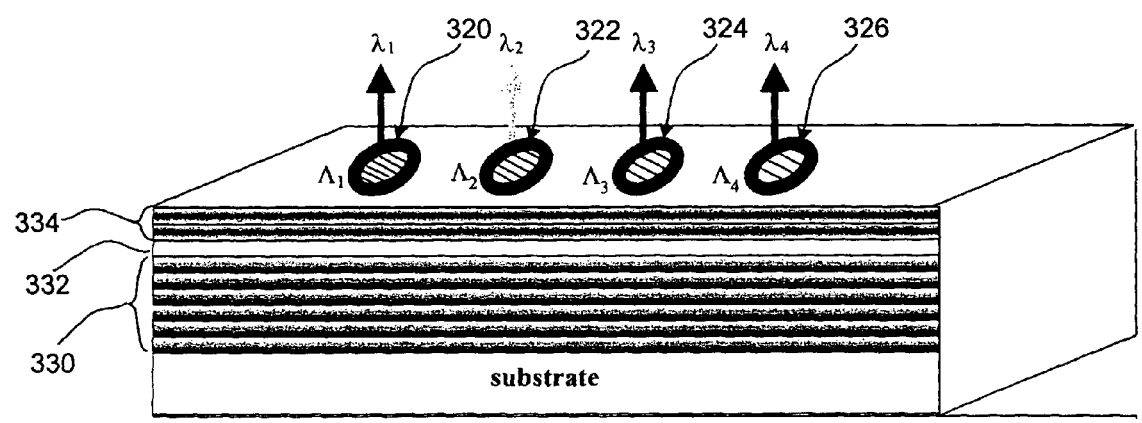
FIG. 16 is a schematic diagram showing an illustrative array of four VCSELs having a common epitaxial structure including a bottom mirror, an active region, a top mirror and a top GMGRF, where the grating period of each GMGRF is different for each VCSEL.

FIG. 16 is a schematic diagram showing an illustrative array of four VCSEL devices 320, 322, 324 and 326 fabricated as a common epitaxial structure. The common epitaxial structure includes a bottom mirror 330, an active region 332, and a top mirror 334. A top GMGRF is integrated with or provided adjacent to the top mirror 334, and in the embodiment shown, the grating period (Λ) of each GMGRF is different for each VCSEL device. As can be seen, the number of top DBR mirror periods is less than the number of bottom DBR mirror periods. As indicated above, the number of top DBR mirror periods is preferably reduced so that the lasing threshold cannot readily be established without the additional reflectance provided by the corresponding GMGRF.

The VCSEL devices 320, 322, 324 and 326 may be processed with topside electrical contacts with the GMGRF films positioned in the emitting aperture of each VCSEL. To tune the GMGRF, and in one example, a 1 nm increase in the grating period (Λ) may yield about a 1.8 nm increase in the resonant wavelength. Thus, if the desired resonant wavelengths were 842 nm, 847 nm, 852 nm, and 857 nm, respectively, then the grating periods for the four VCSEL devices 320, 322, 324 and 326 may be approximately 477.2 nm, 480 nm, 482.8 nm, and 485.8 nm.

Figure 17:
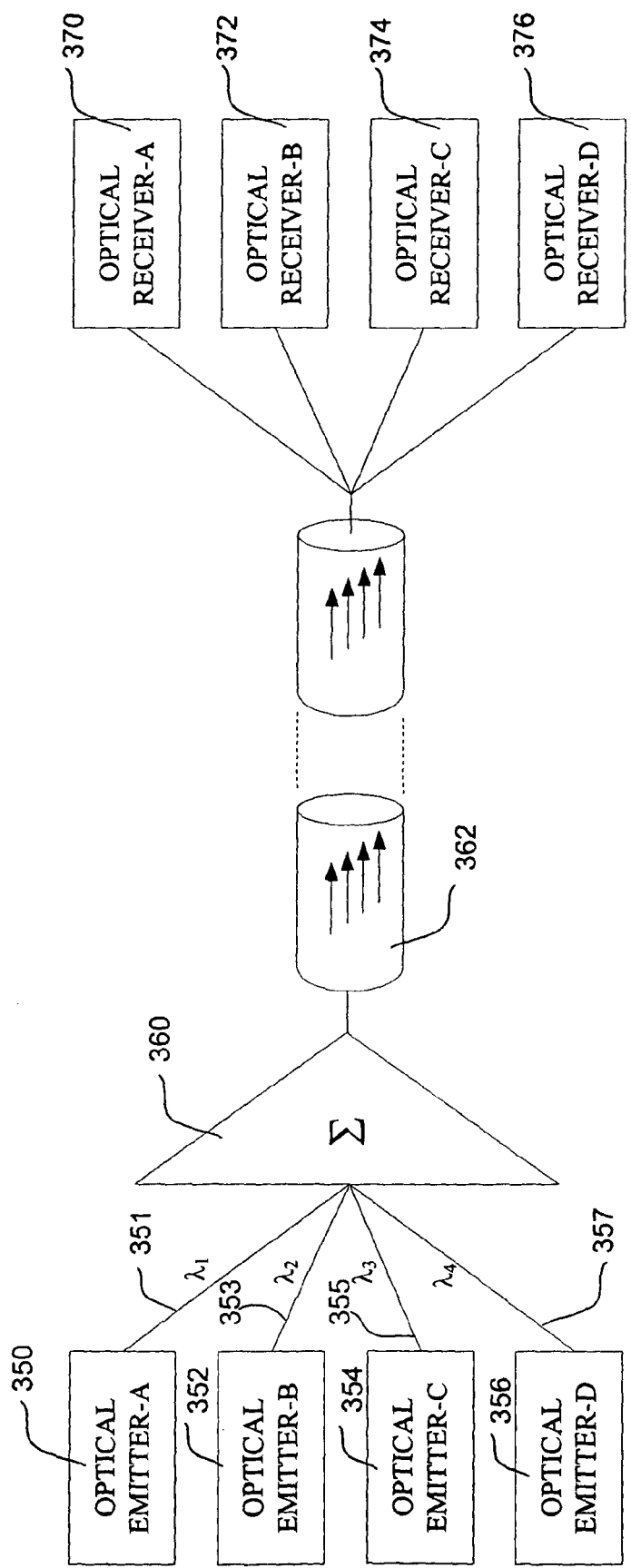
FIG. 17 is a schematic diagram showing an illustrative WDMIVDD application using the array of four VCSELs of FIG. 16.

FIG. 17 is a schematic diagram showing an illustrative WDM/WDD/PDM application using the array of VCSEL devices of FIG. 16. Optical Emitter-A 350 corresponds to VCSEL 320, which produces a first wavelength $\lambda_1$ as shown at 351. Optical Emitter-B 352 corresponds to VCSEL 322, which produces a second wavelength $\lambda_2$ as shown at 353. Optical Emitter-C 354 corresponds to VCSEL 324, which produces a third wavelength $\lambda_3$ as shown at 355. Finally, Optical Emitter-D 356 corresponds to VCSEL 326, which produces a fourth wavelength $\lambda_4$ as shown at 357. The various wavelengths 351, 353, 355 and 357 are provided to a common optical receiver element by block 360. The common optical receiver element may be, for example, a common optical fiber 362, as shown.

In order to increase the aggregate transmission bandwidth of an optical fiber, it is generally preferred that the wavelength spacing of simultaneously transmitted optical data streams, or optical data "channels," be closely packed, to accommodate a larger number of data channels. In other words, the difference in wavelength between two adjacent channels is preferably minimized. Because the wavelength of each VCSEL can be tightly controlled lithographically, a relatively large number of optical data channels can be accommodated. In some cases, the wavelength of adjacent optical channels may be 5 nm or less. Also, and as described above, the polarization direction of the VCSEL devices can be lithographically controlled, which may allow polarization Division Multiplexing (PDM) and/or WDM and PDM multiplexing. This can even further extend the bandwidth of some optical data channels.

In the illustrative embodiment, one or more optoelectronic receivers 370, 372, 374 and 376 are provided. In one embodiment, the light transmitted by the optical fiber 362 is provided to each of the optoelectronic receivers 370, 372, 374 and 376. Each of the optoelectronic receivers 370, 372, 374 and 376 may be tuned to select the wavelength of one (or more) of the optical data channels. For example, and in one illustrative embodiment, each of the optoelectronic receives 370, 372, 374 and 376 is a RCPD device, with a GMGRF resonator that is tuned to a wavelength of a desired optical data channel. Each RCPD may be similar to the VCSEL devices 320, 322, 324 and 326 discussed above with respect to FIG. 16, but may be operated in a reverse bias mode. In some embodiments, the effective reflectivity of the top mirror (including the GMGRF) may be reduced and the lateral dimensions of the resonant cavity may be increased relative to a VCSEL device, which may increase the amount of light that is allowed to enter by the optical cavity.

Alternatively, or in addition, selected wavelengths may be directed to an optical receiver by an optical filter, optical splitter, or the like. In this embodiment, the optical receiver may be a wide band optical receiver, as the wavelength selectivity is provided by the optical filter, optical splitter, or the like, rather than the optical receiver itself.

FIG. 18 is a schematic diagram showing an illustrative GMGRF filter 400 in accordance with the present invention. As described above, the GMGRF filter 400 may be incorporated into or positioned adjacent the top and/or bottom mirror of a VCSEL or RCPD device. The resonant wavelength of the GMGRF 400 may determine, at least to a large extent, the cavity resonance of the VCSEL or RCPD device.

In one illustrative embodiment, the GMGRF 400 includes a buffer layer 402 interposed between a core layer 404 and the top DBR mirror layer 406. The buffer layer 402 also serves as a clad layer. As indicated above, the buffer layer 402 is preferably sufficiently thick, and/or has a sufficiently low refractive index relative to the refractive index of the core layer 404 of the resonant reflector, to substantially prevent energy in the evanescent tail of the guided mode in the core layer 404 from entering an adjacent conductive layer of the optoelectronic device.

In the illustrative embodiment, an upper clad layer 410 is provided over a grating etched into the core layer 404. The grating elements 412 of the grating preferably have a grating period 414, and the core layer 404 preferably has a core depth 418 between adjacent grating elements 412. The overall core thickness at the grating elements 412 is shown at 416. In the illustrative embodiment, the core layer 404 is TiO2 with an index of refraction of about 2.41, and has a core depth of about 0.175 μm. Alternatively, it is contemplated that the core layer 404 may be, for example, GaAs or some other relatively high refractive index dielectric such as ZrO2, HfO2, or Si3N4. The thickness of the core layer 404 preferably is dependent on the refractive index difference between the core layer 404 and the buffer layer 402.

In the illustrative embodiment, the upper clad layer 410 is SiO2 with an index of refraction of about 1.48, and having a clad depth 417 of about 0.285 μm. The upper clad layer 410 extends down between the grating elements 412 of the core layer 404, as shown. Thus, the upper clad layer 410 has an overall clad layer thickness between grating elements 412 that equals the clad depth 417 plus the grating height 420, or in this case about 0.495 μm. The buffer layer 402 in the illustrative embodiment is SiO2, with an index of refraction of 1.48 and a thickness of 0.285 μm. The top layer of the DBR mirror 406 may be, for example, AlGaAs with an index of refraction of 3.2. In this embodiment, and as described above, the buffer layer 402 preferably has an increased thickness and/or a reduced index of refraction, both of which help prevent energy in the evanescent tail of the guided mode in the core layer 404 from entering the top DBR mirror 406.

The resonant wavelength of the GMGRF 400 can be set in a reliable manner by appropriately selecting GMGRF parameters, such as the grating period (Λ) 414, core depth 418 versus grating height 420, grating direction, etc. More specifically, and in one illustrative embodiment, in an array of VCSEL devices having a common epitaxial structure (bottom mirror, active region, top mirror including a GMGRF), the lasing wavelength of each VCSEL in the array can be prescribed individually by changing the GMGRF parameters that affect the resonant wavelength. Most conveniently, this can be done by changing the grating period (Λ) 414 while keeping all other parameters fixed, or by increasing the grating height 420 while maintaining a substantially constant core thickness 416 (and hence reducing the core depth 418 of the core layer 404 by a corresponding amount), while keeping the grating period (Λ) 414 fixed. However, it is contemplated that these and/or other GMGRF parameters maybe changed in any suitable manner to achieve the desired resonant wavelength for each VCSEL in the array.

FIG. 19 is a graph showing the relationship between the grating period (Λ) 414 and the resonant wavelength for the GMGRF shown in FIG. 18. In this example, the DBR epilayers in the top mirror of a VCSEL are represented as a single layer having an average refractive index of 3.2. The upper clad layer 410 and buffer layer 402 have optical thicknesses of a half-wave at approximately 850 nm (about 0.285 μm). The grating elements 412 provide modulation in the dielectric constant of the core layer 404, and enforces coupling of a normally-incident planewave via the first diffractive order of the grating into a guided-mode supported by the core layer 404.

The resonant wavelength of this GMGRF structure can be determined approximately by using the mode-matching condition:

$$\beta = 2\pi/\Lambda \quad \text{Equation (1)}$$

where Λ is the grating period 414 and β is the eigenvalue (propagation wavenumber) of the guided mode excited.

The structure may be modeled as a homogenized multi-layer planar waveguide by replacing the grating layer with a homogeneous film having an effective refractive index ($n_{eff}$) determined by the Rytov effective medium expression, which in a first-order approximation reads:

$$\langle n \rangle^2 = FF \cdot n_{hi}^2 + (1-FF) \cdot n_{lo}^2 \text{ for TE polarization} \quad \text{Equation (2)}$$

OR $$\langle n \rangle^{-2} = FF \cdot n_{hi}^{-2} + (1-FF) \cdot n_{lo}^{-2} \text{ for TM polarization} \quad \text{Equation (3)}$$

where FF equals the grating fill factor defined with respect to the high index material.

A desired resonant wavelength $\lambda_1$ and polarization (TE or TM) are then selected. The film thicknesses are preferably chosen on the basis of out-of-band optical reflectance, throughput, and core isolation from the substrate. The grating may be modeled as its homogenized equivalent thin film, and the structure may be analyzed as a multi-layer planar waveguide. This analysis may yield the guided mode eigenvalues β for the waveguide, and one (usually the fundamental mode with largest β) is chosen. The grating period which excites this mode is then given approximately by equation (1) above. Illustrated results for the GMGRF 400 of FIG. 18 are shown graphically in FIG. 19.

FIG. 20 is a graph showing the relationship between the grating height 420/core depth 418 and the resonant wavelength for the GMGRF shown in FIG. 18. As indicated above, the resonant wavelength of the GMGRF 400 may be controlled by increasing the grating height 420 while maintaining a substantially constant core thickness 416 (and hence reducing the core depth 418 of the core layer 404 by a corresponding amount), while keeping the grating period (Λ) 414 fixed. Illustrated results for the GMGRF 400 of FIG. 18 are shown graphically in FIG. 20 for four combinations of grating height 420 and core depth 418, while leaving the overall core thickness 416 and grating period 414 constant.

Regardless of the method used to choose GMGRF parameters to achieve a desired resonant wavelength, the structure can be analyzed with a grating solver to estimate more precisely the GMGRF resonant wavelength and the Fabry-Perot resonance of the combined top-mirror assembly with the rest of the VCSEL or RCPD structure. If desired, minor adjustments in the GMGRF parameters can then be made to yield a desired resonant wavelength.

It is recognized that the wavelength selectivity capability of such GMGRF filters has applicability in display applications. As the grating itself may determine the wavelength of operation, and fabrication is done lithographically, laterally-displaced wavelength dependent emitters can be formed. Such a structure may also serve as a quasi-tunable laser source. Wavelength tunable VCSELs and detectors, as described above, may also find use in spectroscopic and sensing applications.

The improved performance coupled with the capability to control polarization can also lend itself to applications in polarization-sensitive optical read/write applications. Included are various forms of CD, DVD, and holographic storage applications. Laser printing heads may also benefit. The performance advantage, and use of thinner top and/or bottom mirrors becomes even more paramount when extending VCSELs into the visible wavelengths, where typical all-epitaxial DBRs become prohibitively thick and may require twice as many layers.

Having thus described the preferred embodiments of the present invention, those of skill in the art will readily appreciate that the teachings found herein may be applied to yet other embodiments within the scope of the claims hereto attached.

What is claimed is:

1. An optical system, comprising:
   a first tunable detector; and
   a second tunable detector, each of the first and second tunable detectors including a guided-mode grating resonant reflector filter ("GMGRF") configured such that the GMGRF for the first tunable detector is tuned to select a first optical wavelength and/or polarization, and the GMGRF for the second tunable detector is tuned to select a second optical wavelength and/or polarization.

2. The optical system as recited in claim 1, wherein at least one of the first and second tunable detectors comprises a resonant cavity photo detector ("RCPD").

3. The optical system as recited in claim 1, wherein the first and second tunable detectors each comprise an optoelectronic receiver.

4. The optical system as recited in claim 1, wherein each of the GMGRFs comprises a waveguide and a grating.

5. The optical system as recited in claim 1, wherein each of the GMGRFs comprises a core layer and grating layer positioned adjacent each other.

6. The optical system as recited in claim 1, wherein tuning of at least one of the GMGRFs is based at least in part upon a selected value of at least one GMGRF parameter.

7. The optical system as recited in claim 5, wherein the at least one GMGRF parameter comprises at least one of: a grating period; a grating height; a core thickness; and, a grating direction.

8. The optical system as recited in claim 1, wherein the first and second tunable detectors are configured for optical communication with an optical fiber.

9. The optical system as recited in claim 1, wherein the first and second tunable detectors are fabricated on a common substrate.

10. The optical system as recited in claim 1, wherein each of the first and second tunable detectors further comprises:
a top mirror; and
a bottom mirror, the corresponding GMGRF being positioned adjacent one of the top or bottom mirrors.

11. The optical system as recited in claim 1, wherein each of the first and second tunable detectors further comprises:
a top mirror; and
a bottom mirror, the corresponding GMGRF being incorporated into one of the top or bottom mirrors.

12. An optical system, comprising:
a first optoelectronic receiver; and
a second optoelectronic receiver, each of the first and second optoelectronic receivers including:
a guided-mode grating resonant reflector filter ("GMGRF") configured such that the GMGRF for the first optoelectronic receiver is tuned to select a first optical wavelength and/or polarization and the GMGRF for the second optoelectronic receiver is tuned to select a second optical wavelength and/or polarization;
a top mirror; and
a bottom mirror, the GMGRF being positioned adjacent one of the top and bottom mirrors.

13. The optical system as recited in claim 12, wherein at least one of the first and second optoelectronic receivers comprises a resonant cavity photo detector ("RCPD").

14. The optical system as recited in claim 12, wherein at least one of the GMGRFs comprises a core layer and a grating layer positioned adjacent each other.

15. The optical system as recited in claim 14, wherein the grating layer extends into the core layer.

16. The optical system as recited in claim 14, wherein the core layer defines a core thickness, and the grating layer defines a grating period, a grating height and, a grating direction.

17. The optical system as recited in claim 12, wherein tuning of at least one of the optoelectronic receivers is facilitated by setting and/or adjusting at least one of: a core thickness; a grating period; a grating direction; and, a grating height.

18. The optical system as recited in claim 12, wherein the first and second optoelectronic receivers are monolithically formed on a common substrate.

19. The optical system as recited in claim 12, wherein at least one of the mirrors comprises a plurality of DBR layers.

20. The optical system as recited in claim 12, wherein at least one of the optoelectronic receivers is configured to be operated in a reverse bias mode.

21. The optical system as recited in claim 12, wherein at least one of the optoelectronic receivers is tuned to select a plurality of wavelengths and/or polarizations.

* * * * *